United States Patent
Sunwoo et al.

(10) Patent No.: US 11,647,644 B2
(45) Date of Patent: May 9, 2023

(54) ROLLABLE, SLIDABLE, AND STRETCHABLE COVER WINDOW AND METHOD OF MANUFACTURING THE SAME

(71) Applicant: UTI INC., Chungcheongnam-do (KR)

(72) Inventors: Kukhyun Sunwoo, Gyeonggi-do (KR); Tea Joo Ha, Chungcheongnam-do (KR); Jong In Park, Gyeonggi-do (KR)

(73) Assignee: UTI INC.

( * ) Notice: Subject to any disclaimer, the term of this patent is extended or adjusted under 35 U.S.C. 154(b) by 129 days.

(21) Appl. No.: 17/209,659

(22) Filed: Mar. 23, 2021

(65) Prior Publication Data

US 2022/0263043 A1 Aug. 18, 2022

(30) Foreign Application Priority Data

Feb. 17, 2021 (KR) ........................ 10-2021-0021188

(51) Int. Cl.
*H10K 59/12* (2023.01)
*H10K 71/80* (2023.01)
*H10K 71/00* (2023.01)
*C03C 15/00* (2006.01)
*H10K 77/10* (2023.01)
*H10K 102/00* (2023.01)
*H01L 51/52* (2006.01)
*H01L 27/32* (2006.01)
(Continued)

(52) U.S. Cl.
CPC ............ *H01L 51/524* (2013.01); *C03C 15/00* (2013.01); *H01L 27/3244* (2013.01); *H01L 51/003* (2013.01); *H01L 51/0097* (2013.01); *H01L 51/56* (2013.01); *H01L 2227/326* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 10,439,164 | B2 * | 10/2019 | Song | H01L 51/5246 |
| 2019/0067633 | A1 * | 2/2019 | Song | H01L 51/5246 |
| 2022/0261038 | A1 * | 8/2022 | Wu | G06F 3/0446 |

OTHER PUBLICATIONS

Definition of concave downloaded from URL< https://www.merriam-webster.com/dictionary/concave> on Sep. 20, 2022. (Year: 2022).*

* cited by examiner

*Primary Examiner* — J. E. Schoenholtz
(74) *Attorney, Agent, or Firm* — Mendelsohn Dunleavy, P.C.

(57) ABSTRACT

Disclosed are a rollable, slidable, and stretchable cover window and a method of manufacturing the same. The rollable, slidable, and stretchable cover window includes a planar portion formed so as to correspond to a planar region of a rollable, slidable, and stretchable display and a flexible portion formed so as to be connected to the planar portion, the flexible portion being formed so as to correspond to a flexible region of the rollable, slidable, and stretchable display, wherein the rollable, slidable, and stretchable cover window includes a glass substrate and a shock compensation pattern unit formed on the glass substrate, and the shock compensation pattern unit is formed at the flexible portion or (Continued)

is formed at each of the planar portion and the flexible portion, the shock compensation pattern unit having concave-convex-shaped patterns.

41 Claims, 13 Drawing Sheets

(51) Int. Cl.
*H01L 51/00* (2006.01)
*H01L 51/56* (2006.01)

ROLLABLE, SLIDABLE, AND STRETCHABLE COVER WINDOW AND METHOD OF MANUFACTURING THE SAME

CROSS-REFERENCE TO RELATED APPLICATION

This application claims priority from Korean Patent Application No. 10-2021-0021188, filed on Feb. 17, 2021, in the Korean Intellectual Property Office, the disclosure of which is incorporated herein by reference in its entirety.

BACKGROUND OF THE INVENTION

1. Field of the Invention

The present invention relates to a cover window and a method of manufacturing the same, and more particularly to a rollable, slidable, and stretchable cover window having a shock compensation pattern unit formed on a glass substrate in order to prevent in-plane microscopic crack propagation and to disperse stress and shock, whereby strength and folding properties of the rollable, slidable, and stretchable cover window are secured, and a method of manufacturing the same.

2. Description of the Related Art

With recent rapid development of electric and electronic technologies and an increase in new demands of the times and various demands of consumers, various types of display products have been manufactured. Thereamong, research on a flexible display capable of being folded and unfolded has been actively conducted.

In the first place, research on folding the flexible display was conducted, and now research on rolling, sliding, and stretching of the flexible display is being conducted. Not only a display panel but also a cover window configured to protect the display panel must be flexible.

Such a rollable, slidable, and stretchable cover window must be basically flexible and must have no wrinkles at the flexible region thereof after repeated folding, and image distortion must not occur.

For a conventional cover window for flexible displays, a polymer film, such as a PI film or a PET film, is attached to the surface of a display panel.

Since the mechanical strength of the polymer film is low, however, the polymer film serves merely to prevent scratches on the display panel. In addition, the polymer film has low resistance to shock and low transmittance. Furthermore, the polymer film is relatively expensive.

As the number of folds of the display increases, the flexible region of the polymer film is wrinkled, whereby the flexible region of the polymer film is damaged. For example, the polymer film is pressed or torn at the time of folding limit evaluation (generally 200,000 times).

In recent years, various research on a glass-based cover window has been conducted in order to overcome the limit of the polymer film cover window.

Such a glass-based cover window requires fundamental physical properties. For example, image distortion must not occur, and the glass-based cover window must have sufficient strength with respect to repetitive contact of a touch pen and specific pressure while folding properties of the cover window must be satisfied.

With increasing recent consumer demand for various folding type flexible displays, such as foldable, rollable, slidable, and stretchable displays, research on such displays has been actively conducted. In addition, research on a cover window used to protect a display panel, such as an organic light-emitting diode (OLED) display panel, has also been conducted.

For a conventional foldable cover window, folding tests are performed with respect to only a folding zone about the central axis.

The result of measurement (evaluation of two-point bending and folding limit) of folding properties of the folding region about the central axis (e.g. based on 1.5R (4.71 mm section) and 5R (15.7 mm section) reveals that an average pass rate of a folding screen is about 90%. That is, the failure rate is about 10%.

In addition, for a conventional rollable, slidable, and stretchable cover window, folding properties of the cover window at the section that is folded around a hinge while being slid or rolled (40 to 60% of the total area) must be measured.

For example, on the assumption that the length of a sliding portion of a slidable cover window is 100 mm based on 5R, expected yield is $0.9^{\wedge}(100/(5*n))=0.509$, i.e. about 50%. On the assumption that the length of the sliding portion of the slidable cover window is 100 mm based on 2R, expected yield is $0.9^{\wedge}(100/(2*n))=0.187$, i.e. about 19%.

Such folding failure is determined to result from inherent defects of a glass substrate itself (compositional non-uniformity and physical defects) and physical defects occurring during processing.

FIG. 1 is a photograph showing folding failure of a conventional cover window due to in-plane crack propagation in a flexible region thereof caused by inherent defects and physical defects.

Consequently, research on the optimum structure of any of various folding type cover windows, such as foldable, rollable, slidable, and stretchable cover windows, at which image distortion does not occur while both the folding properties and the strength properties of the cover window are satisfied is necessary.

SUMMARY OF THE INVENTION

The present invention has been made in view of the above problems, and it is an object of the present invention to provide a rollable, slidable, and stretchable cover window having a shock compensation pattern unit formed on a glass substrate in order to prevent in-plane microscopic crack propagation and to disperse stress and shock, whereby strength and folding properties of the rollable, slidable, and stretchable cover window are secured.

In accordance with an aspect of the present invention, the above and other objects can be accomplished by the provision of a rollable, slidable, and stretchable cover window including a planar portion formed so as to correspond to a planar region of a rollable, slidable, and stretchable display and a flexible portion formed so as to be connected to the planar portion, the flexible portion being formed so as to correspond to a flexible region of the rollable, slidable, and stretchable display, wherein the rollable, slidable, and stretchable cover window includes a glass substrate and a shock compensation pattern unit formed on the glass substrate, and the shock compensation pattern unit is formed at the flexible portion or is formed at each of the planar portion and the flexible portion, the shock compensation pattern unit having concave-convex-shaped patterns.

In accordance with another aspect of the present invention, there is provided a method of manufacturing a rollable, slidable, and stretchable cover window including a planar portion formed so as to correspond to a planar region of a rollable, slidable, and stretchable display and a flexible portion formed so as to be connected to the planar portion, the flexible portion being formed so as to correspond to a flexible region of the rollable, slidable, and stretchable display, the method including a first step of forming a resist layer on a glass substrate, a second step of patterning the resist layer to form a resist pattern layer for formation of a first pattern on the entire surface or a flexible region of the glass substrate, a third step of performing a primary etching process using the resist pattern layer of the second step as a mask to form a first pattern on the entire surface or the flexible region of the glass substrate and removing the resist pattern layer, a fourth step of forming a resist layer on the glass substrate having the first pattern formed thereon, a fifth step of patterning the resist layer to form a resist pattern layer for formation of a second pattern on the flexible region or to form a resist pattern layer for formation of a second pattern on the flexible region and for formation of a third pattern on a planar region of the glass substrate, a sixth step of performing a secondary etching process using the resist pattern layer of the fifth step as a mask to further etch the flexible region, thereby forming a second pattern at the flexible region, or to etch the entire surface of the glass substrate, thereby forming a second pattern at the flexible region and forming a third pattern at the planar region, and removing the resist pattern layer, and a seventh step of strengthening the glass substrate, whereby a shock compensation pattern unit is formed at the flexible portion and the planar portion.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

The present invention relates to a rollable, slidable, and stretchable cover window, and more particularly to a rollable, slidable, and stretchable cover window having a shock compensation pattern unit formed on a glass substrate in order to disperse shock, whereby shock resistance of the rollable, slidable, and stretchable cover window is improved and strength and folding properties of the rollable, slidable, and stretchable cover window are secured, and a method of manufacturing the same.

That is, the shock compensation pattern unit is realized on the glass substrate, whereby it is possible to prevent in-plane crack propagation in a flexible region and to disperse stress. In addition, at the time of pen drop, the shock is dispersed between patterns to increase resistance to pen drop, and therefore it is possible to simultaneously improve strength properties and folding properties of the rollable, slidable, and stretchable cover window.

In addition, the shock compensation pattern unit is realized on the glass substrate, whereby it is possible to remove scratches or microscopic cracks from the surface of the glass substrate, and therefore it is possible to further improve yield while improving strength properties and folding properties of the rollable, slidable, and stretchable cover window due to removal or reduction of appearance defects.

Figure 1:
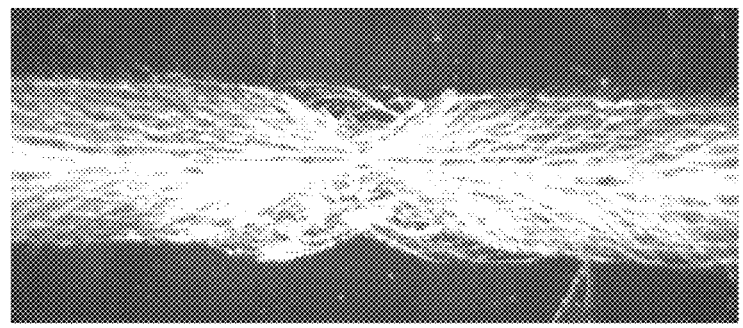
FIG. 1 is a photograph showing folding failure of a conventional cover window due to in-plane crack propagation in a flexible region thereof.
Figure 2:
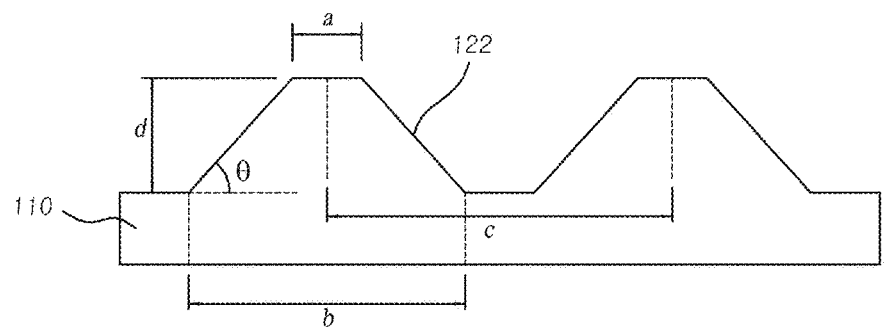
FIG. 2 is a schematic view of a shock compensation pattern unit according to an embodiment of the present invention.
Figure 3A:
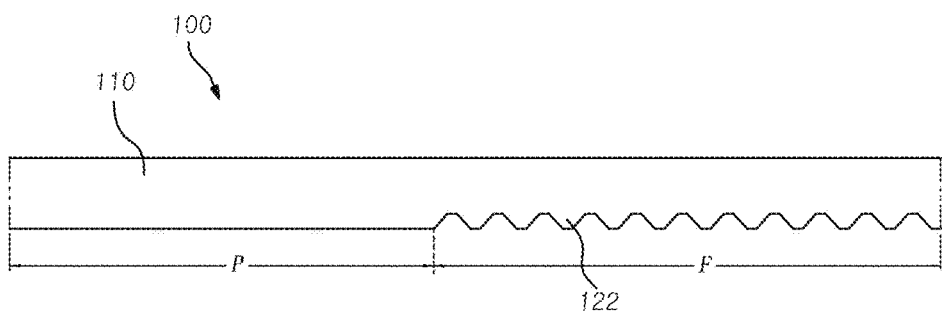
FIG. 3A is a sectional view schematically showing the case in which a shock compensation pattern unit is formed at one surface of a flexible portion in accordance with an embodiment of the present invention.
Figure 3B:
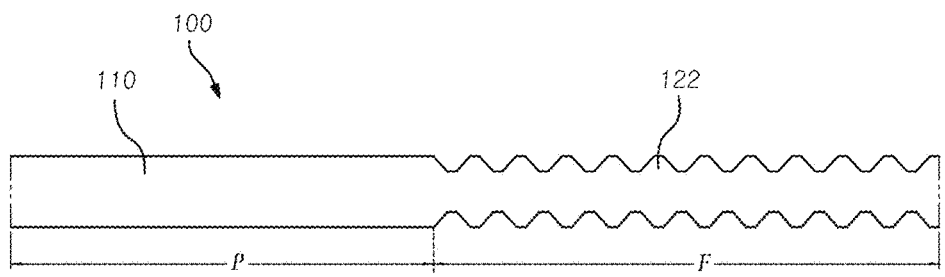
FIG. 3B is a sectional view schematically showing the case in which a shock compensation pattern unit is formed at opposite surfaces of a flexible portion in accordance with an embodiment of the present invention.
Figure 3C:
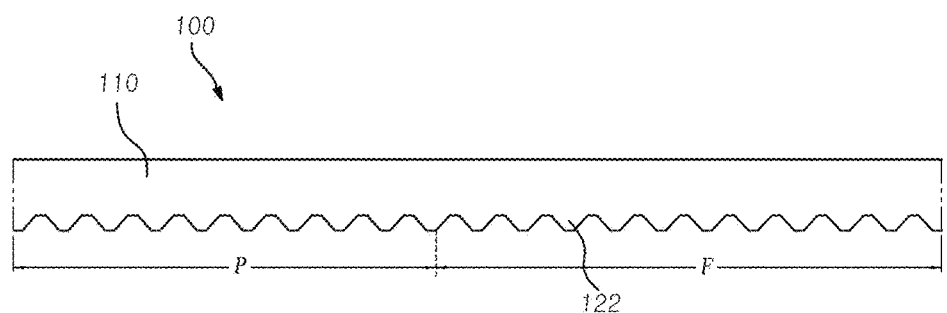
FIG. 3C is a sectional view schematically showing the case in which a shock compensation pattern unit is formed at one surface of a planar portion and one surface of a flexible portion in accordance with an embodiment of the present invention.
Figure 3D:
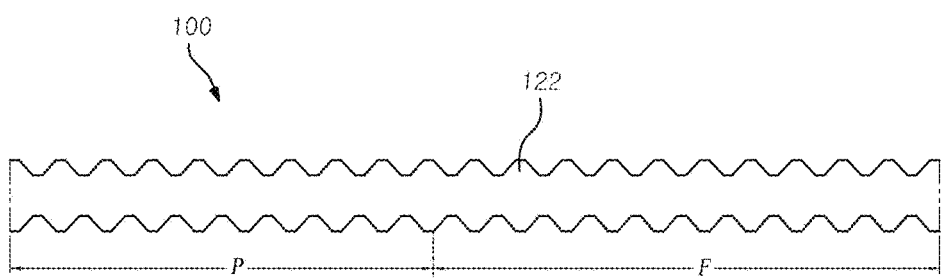
FIG. 3D is a sectional view schematically showing the case in which a shock compensation pattern unit is formed at opposite surfaces of a planar portion and opposite surfaces of a flexible portion in accordance with an embodiment of the present invention.
Figure 4A:
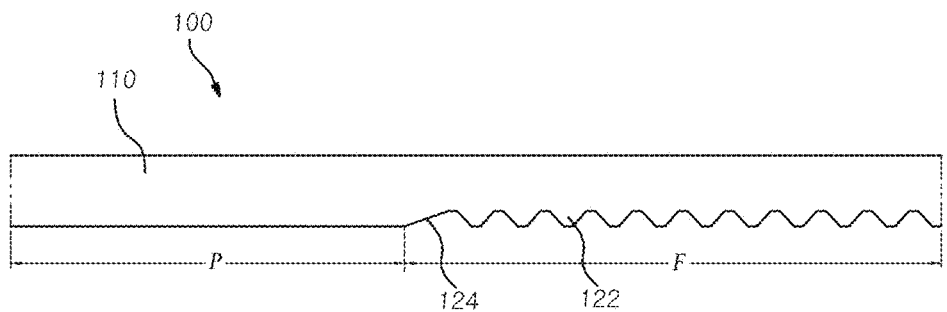
FIG. 4A is a sectional view schematically showing the case in which a shock compensation pattern unit is formed at one surface of a flexible portion in accordance with another embodiment of the present invention.
Figure 4B:
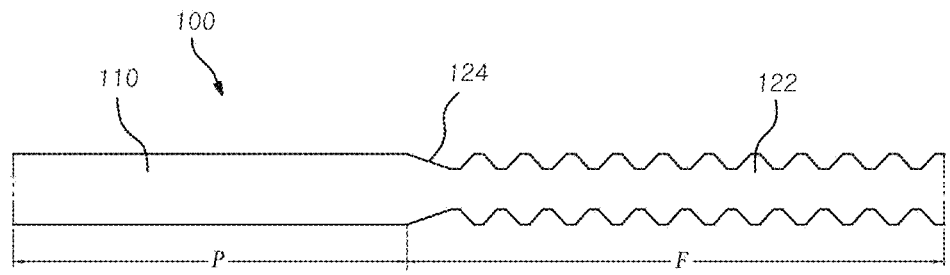
FIG. 4B is a sectional view schematically showing the case in which a shock compensation pattern unit is formed at opposite surfaces of a flexible portion in accordance with another embodiment of the present invention.
Figure 5A:
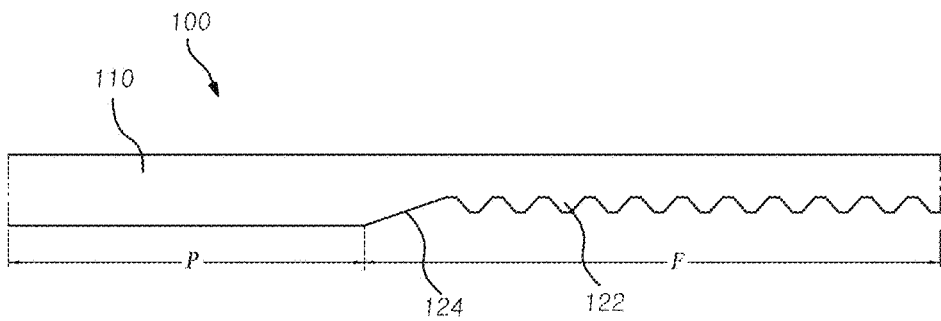
FIG. 5A is a sectional view schematically showing the case in which a shock compensation pattern unit is formed at one surface of a flexible portion in accordance with another embodiment of the present invention.
Figure 5B:
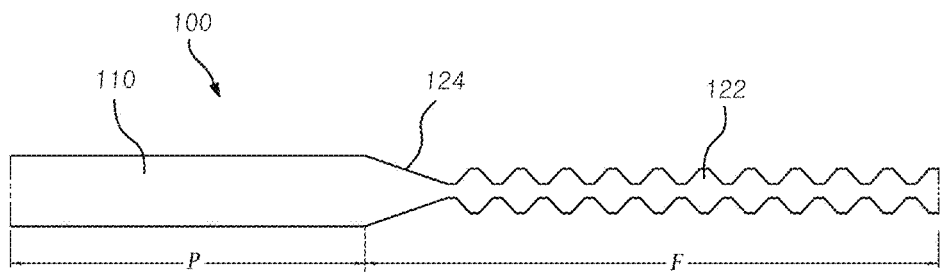
FIG. 5B is a sectional view schematically showing the case in which a shock compensation pattern unit is formed at opposite surfaces of a flexible portion in accordance with another embodiment of the present invention.
Figure 6A:
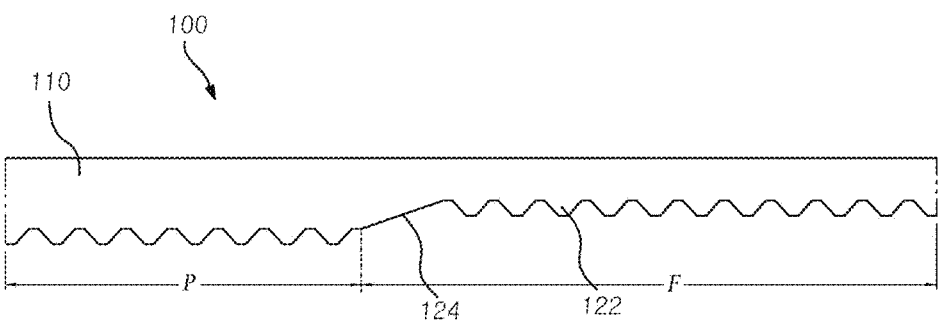
FIG. 6A is a sectional view schematically showing the case in which a shock compensation pattern unit is formed at one surface of a planar portion and one surface of a flexible portion in accordance with another embodiment of the present invention.
Figure 6B:
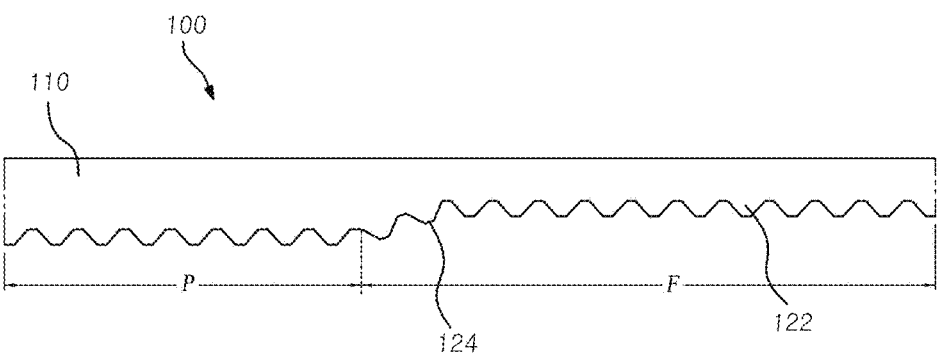
FIG. 6B is a sectional view schematically showing the case in which a shock compensation pattern unit is formed at one surface of a planar portion and one surface of a flexible portion in accordance with another embodiment of the present invention.
Figure 10:
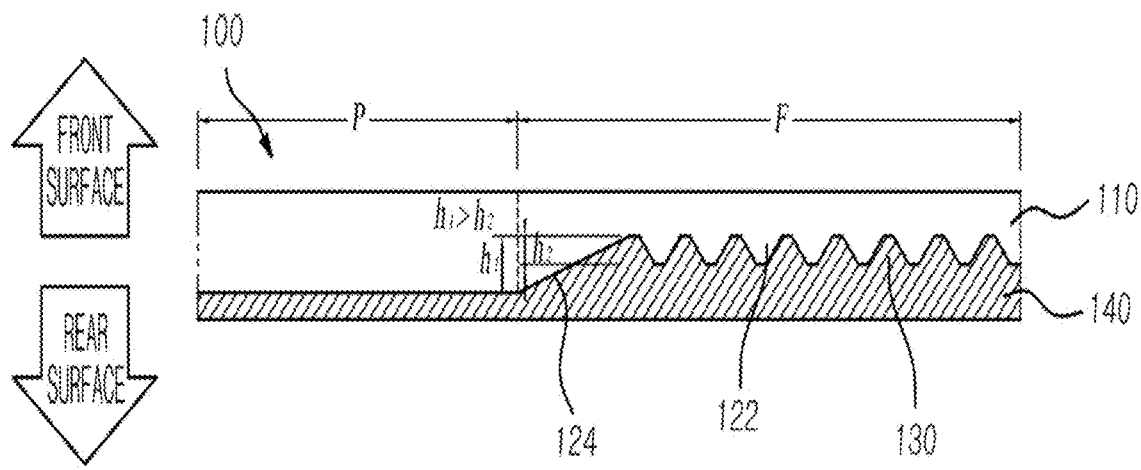
FIG. 10 is a sectional view schematically showing a rollable, slidable, and stretchable cover window according to an embodiment of the present invention.
Figure 11:
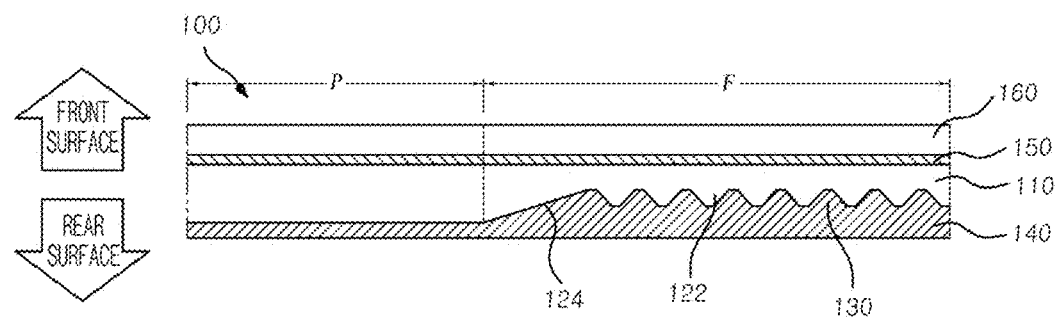
FIG. 11 is a sectional view schematically showing a rollable, slidable, and stretchable cover window according to another embodiment of the present invention.
Figure 12A:
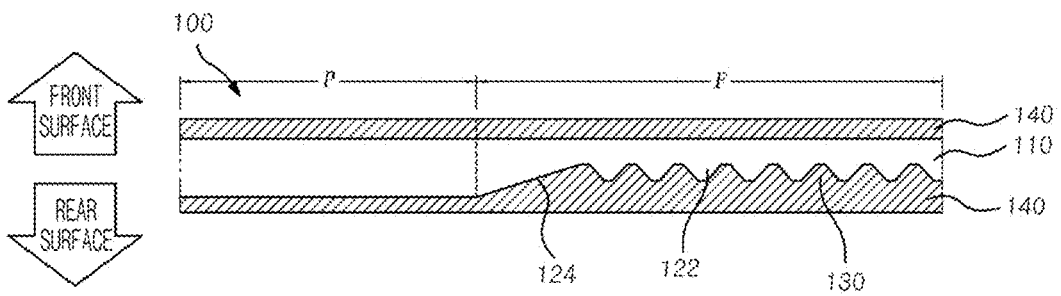
FIG. 12A is a sectional view schematically showing a rollable, slidable, and stretchable cover window according to another embodiment of the present invention.
Figure 12B:
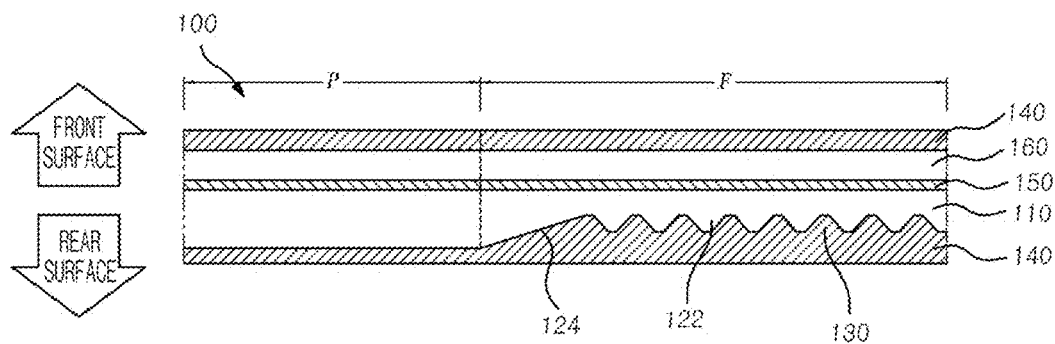
FIG. 12B is a sectional view schematically showing a rollable, slidable, and stretchable cover window according to another embodiment of the present invention.
Figure 13A:
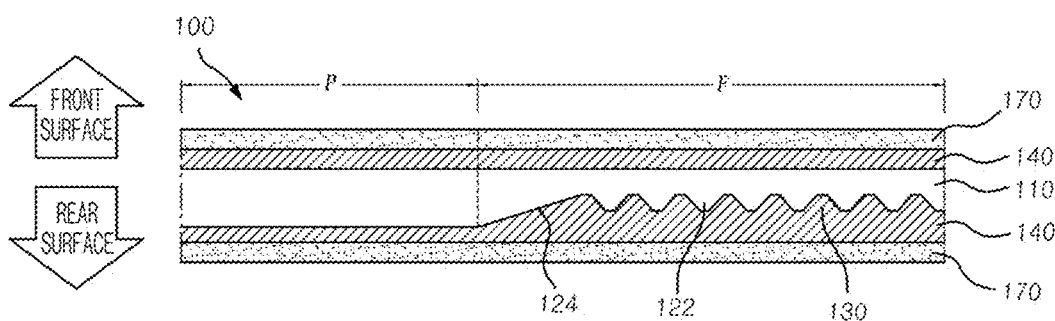
FIG. 13A is a sectional view schematically showing a rollable, slidable, and stretchable cover window according to another embodiment of the present invention.
Figure 13B:
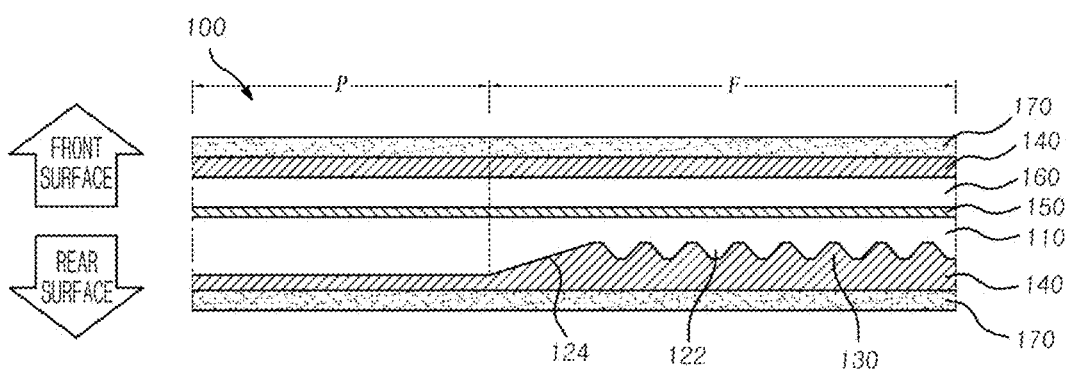
FIG. 13B is a sectional view schematically showing a rollable, slidable, and stretchable cover window according to another embodiment of the present invention.
Figure 14:
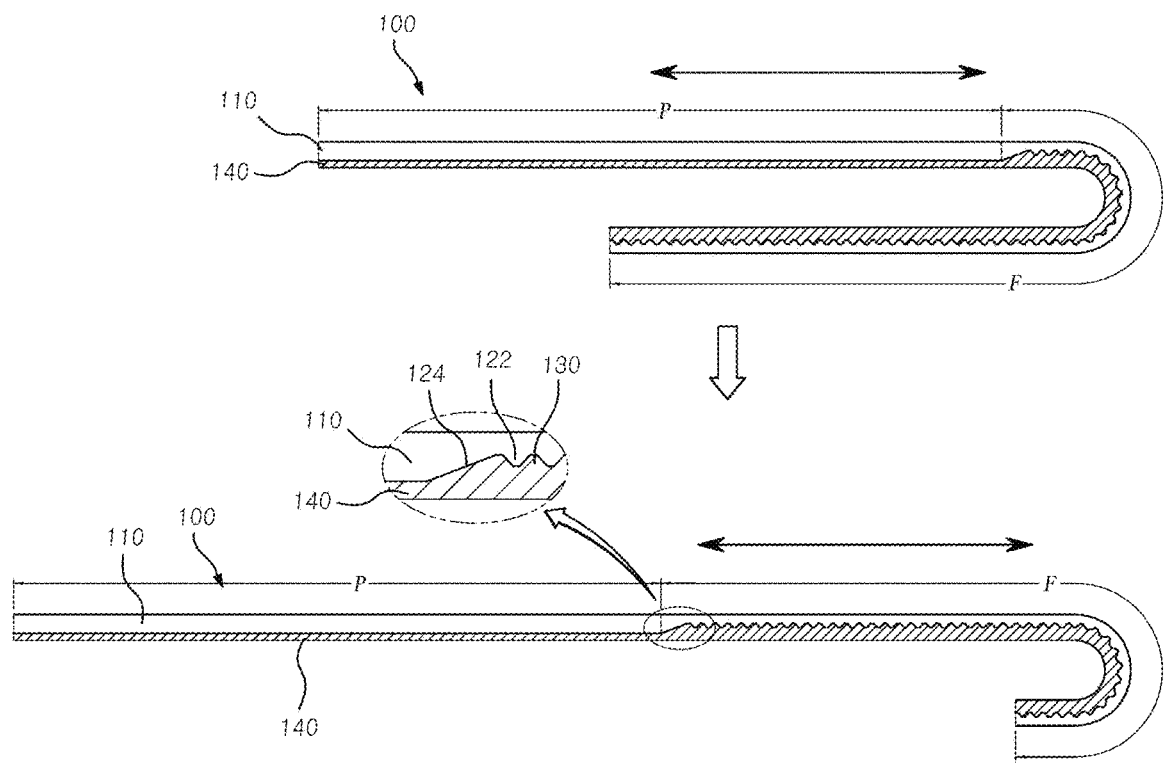
FIG. 14 is a sectional view schematically showing a slidable cover window according to an embodiment of the present invention.
Figure 15:
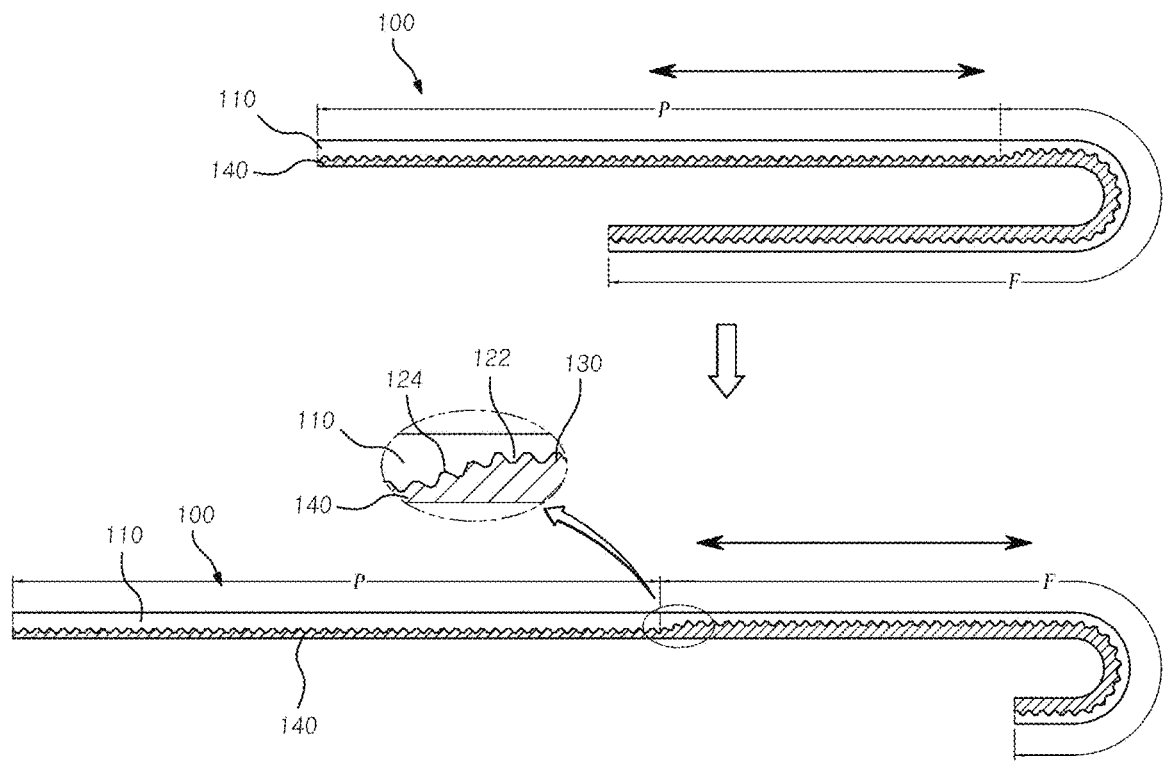
FIG. 15 is a sectional view schematically showing a slidable cover window according to another embodiment of the present invention.
Figure 16:
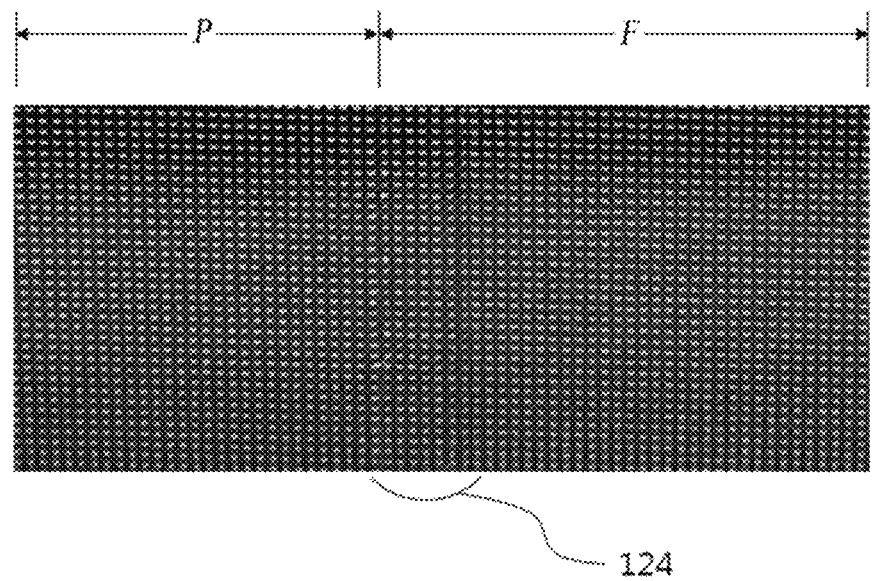
FIG. 16 is a view showing a front image of the slidable cover window according to the embodiment of FIG. 15.
Figure 17:
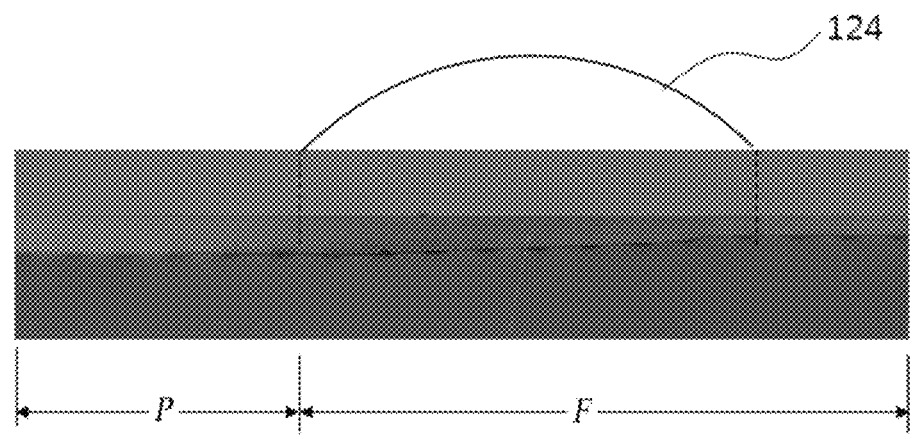
FIG. 17 is a view showing a sectional image of the slidable cover window according to the embodiment of FIG. 15.

Hereinafter, the present invention will be described in detail with reference to the accompanying drawings. FIG. 2 is a schematic view of a shock compensation pattern unit according to an embodiment of the present invention, FIG. 3A is a sectional view schematically showing the case in which a shock compensation pattern unit is formed at one surface of a flexible portion in accordance with an embodiment of the present invention, FIG. 3B is a sectional view schematically showing the case in which a shock compensation pattern unit is formed at opposite surfaces of a flexible portion in accordance with an embodiment of the present invention, FIG. 3C is a sectional view schematically showing the case in which a shock compensation pattern unit is formed at one surface of a planar portion and one surface of a flexible portion in accordance with an embodiment of the present invention, FIG. 3D is a sectional view schematically showing the case in which a shock compensation pattern unit is formed at opposite surfaces of a planar portion and opposite surfaces of a flexible portion in accordance with an embodiment of the present invention, FIG. 4A is a sectional view schematically showing the case in which a shock compensation pattern unit is formed at one surface of a flexible portion in accordance with another embodiment of the present invention, FIG. 4B is a sectional view schematically showing the case in which a shock compensation pattern unit is formed at opposite surfaces of a flexible portion in accordance with another embodiment of the present invention, FIG. 5A is a sectional view schematically showing the case in which a shock compensation pattern unit is formed at one surface of a flexible portion in accordance with another embodiment of the present invention, FIG. 5B is a sectional view schematically showing the case in which a shock compensation pattern unit is formed at opposite surfaces of a flexible portion in accordance with another embodiment of the present invention, FIG. 6A is a sectional view schematically showing the case in which a shock compensation pattern unit is formed at one surface of a planar portion and one surface of a flexible portion in accordance with another embodiment of the present invention, FIG. 6B is a sectional view schematically showing the case in which a shock compensation pattern unit is formed at one surface of a planar portion and one surface of a flexible portion in accordance with another embodiment of the present invention, FIGS. 7, 8, 9A and 9B are schematic views showing rollable, slidable, and stretchable cover window manufacturing methods according to various embodiments of the present invention, FIG. 10 is a sectional view schematically showing a rollable, slidable, and stretchable cover window according to an embodiment of the present invention, FIG. 11 is a sectional view schematically showing a rollable, slidable, and stretchable cover window according to another embodiment of the present invention, FIG. 12A is a sectional view schematically showing a rollable, slidable, and stretchable cover window according to another embodiment of the present invention, FIG. 12B is a sectional view schematically showing a rollable, slidable, and stretchable cover window according to another embodiment of the present invention, FIG. 13A is a sectional view schematically showing a rollable, slidable, and stretchable cover window according to another embodiment of the present invention, FIG. 13B is a sectional view schematically showing a rollable, slidable, and stretchable cover window according to another embodiment of the present invention, FIG. 14 is a sectional view schematically showing a slidable cover window according to an embodiment of the present invention, FIG. is a sectional view schematically showing a slidable cover window according to another embodiment of the present invention, FIG. 16 is a view showing a front image of the slidable cover window according to the embodiment of FIG. 15, and FIG. 17 is a view showing a sectional image of the slidable cover window according to the embodiment of FIG. 15.

As shown, the rollable, slidable, and stretchable cover window 100 according to the present invention is a rollable, slidable, and stretchable cover window including a planar portion P formed so as to correspond to a planar region of a rollable, slidable, and stretchable display and a flexible portion F formed so as to be connected to the planar portion P, the flexible portion F being formed so as to correspond to a flexible region of the rollable, slidable, and stretchable display, wherein a shock compensation pattern unit 122 is formed at the flexible portion F or is formed at the planar portion P and the flexible portion F, and wherein the shock compensation pattern unit 122 has concave-convex-shaped patterns.

In the present invention, the flexible region of the display means a rollable, slidable, or stretchable portion of the display in the case in which the display is a rollable, slidable, and stretchable display. In the present invention, the portion of the cover window corresponding to the region is referred to as a "flexible portion" F of the cover window 100, and the planar region of the cover window excluding the flexible portion F are referred to as "planar portion" P of the cover window 100.

In particular, the cover window according to the present invention may be a glass-based cover window, wherein the planar portion P and the flexible portion F may generally be formed so as to have equal thicknesses or the flexible portion F may be slimmed so as to have a thickness less than the thickness of the planar portion P.

In the case in which the flexible portion F is slimmed so as to have a thickness less than the thickness of the planar portion P, the thickness of the planar portion P of the cover window 100 is generally 50 to 300 μm, and the thickness of the flexible portion F of the cover window 100 is about 10 to 150 μm. Consequently, a very thin sheet of glass is processed to form the flexible portion F.

Here, the length of the flexible portion F is designed in consideration of the radius of curvature of the portion of the cover window 100 that is deformed, e.g. slid or rolled, in response to deformation of the display panel. In general, the length of the flexible portion F is set to the radius of curvaturexn. The thickness of the cover window 100 at the flexible portion F is 10 to 150 μm.

In the case in which the depth of the flexible portion F is too large, i.e. in the case in which the flexible region of the cover window 100 is too thin, foldability is high, but wrinkles are formed or strength is lowered at the time of strengthening. In the case in which the flexible portion F is formed excessively thick, on the other hand, flexibility, restoring force, and elastic force at the flexible region are decreased, whereby folding properties of the cover window are deteriorated. Consequently, it is preferable that the thickness of the cover window 100 at the flexible portion F be about 10 to 150 μm.

In the present invention, the cover window 100 is a glass-based cover window having a thickness of 50 to 300 μm, which is used after chemical strengthening. Within the above thickness range, the length and depth of the flexible portion F are appropriately designed, as described above. In the case in which the cover window 100 has a thickness less than the above thickness range, the thickness of the flexible region of the cover window 100 is too small after the flexible portion F is formed, whereby the above problems occur. In the case in which the cover window 100 has a thickness greater than the above thickness range, on the other hand, flexibility, restoring force, and elastic force of the glass-based cover window are reduced, whereby weight reduction of a display product is hindered.

In an embodiment of the present invention, the flexible portion F is slimmed inwards from the flexible region of the cover window 100 so as to generally have a quadrangular trench shape. An inclined portion 124 having a gradually increasing thickness from the flexible portion F may be formed at one side end or opposite side ends of the flexible portion F such that the flexible portion F is smoothly connected to the planar region of the cover window 100.

In particular, an inclined portion 124 having a low gradient is formed at one side end of the flexible portion F (the border with the planar portion P) so as to similarly adjust an angle of reflection by a reflective surface at the entire region of the flexible portion F in order to minimize light interference and visibility to the naked eye at the reflective surface.

In the present invention, folding properties and strength properties of the cover window are maintained. Consequently, the cover window is formed on the entire surface of the display panel to protect the display panel. Alternatively, the cover window may be disposed on a clear polyimide (CPI) cover in order to protect the CPI cover. As described above, the present invention provides a glass-based rollable, slidable, or stretchable cover window 100 having a flexible portion F that is a thin sheet applicable to a rollable, slidable, or stretchable display while having improved strength and folding properties of the cover window, wherein the shock compensation pattern unit 122 is formed at the flexible portion F or is formed at the planar portion P and the flexible portion F.

To this end, as shown in FIGS. 2 to 6, the cover window according to the present invention includes a shock compensation pattern unit 122 formed on a glass substrate 110, wherein the shock compensation pattern unit 122 has concave-convex-shaped patterns.

The shock compensation pattern unit 122 may be formed at the surface at which the flexible portion F is formed, i.e. one surface or opposite surfaces of the cover window 100. In addition, the shock compensation pattern unit 122 may be formed at the planar portion P as well as the flexible portion F, i.e. the entire surface of the glass substrate 110.

The shock compensation pattern unit 122 is formed by etching the glass substrate 110 through a dry or wet etching process so as to have successive patterns of the same size or different sizes that are arranged regularly or irregularly. The shock compensation pattern unit 122 is formed so as to have concave-convex-shaped patterns.

In particular, the shock compensation pattern unit 122 may be formed so as to have at least one of a polygonal shape, an oval shape, and a circular shape or a combination thereof as the horizontal sectional shape thereof, and the shock compensation pattern unit 122 may have lattice-array patterns or cross-array patterns in order to improve folding properties of the cover window and to uniformly disperse shock.

That is, in order to improve folding properties of the cover window 100, predetermined patterns are formed in the flexible portion F in a process of etching for slimming to form the flexible portion F, or predetermined patterns are formed at the planar portion P and the flexible portion F through a predetermined patterning process.

FIG. 2 is a schematic view of a shock compensation pattern unit according to an embodiment of the present invention, wherein the sectional shape of the shock compensation pattern unit is a trapezoidal shape, and the edge of each pattern is formed so as to be inclined.

The patterns of the shock compensation pattern unit according to the present invention are formed so as to have a concave-convex shape, wherein the edge of each pattern is formed so as to be inclined at a predetermined angle, whereby it is possible to minimize light reflection from inclined surfaces due to the patterns, and therefore it is possible to minimize pattern visibility to the naked eye.

Generally, in the case in which the rollable, slidable, and stretchable cover window 100 is manufactured using a glass material, the thickness of the glass substrate 110 must be small. In order to secure strength properties, however, the glass substrate 110 must have a specific thickness or more.

In the case in which the rollable, slidable, and stretchable cover window 100 is manufactured using the glass substrate, as described above, folding properties of the cover window at the section that is folded around a hinge while being slid or rolled (40 to 60% of the total area) must be measured.

For example, on the assumption that the length of a sliding portion of a slidable cover window is 100 mm based on 5R, expected yield is $0.9^{(100/(5*n))}=0.509$, i.e. about 50%. On the assumption that the length of the sliding portion of the slidable cover window is 100 mm based on 2R, expected yield is $0.9^{(100/(2*n))}=0.187$, i.e. about 19%.

Such folding failure is determined to result from inherent defects of the glass substrate itself (compositional non-uniformity and physical defects) and physical defects occurring during processing.

In the present invention, the shock compensation pattern unit 122 is formed on the glass substrate 100 in order to remove the inherent defects of the glass substrate itself and the physical defects occurring during processing, as described above, in the case in which the rollable, slidable, and stretchable cover window 100 is manufactured using the glass substrate 100.

As described above, the conventional folding yield is merely 50% or less. In the rollable, slidable, and stretchable cover window 100 according to the present invention, however, the shock compensation pattern unit 122 is formed at one surface or opposite surfaces of the glass substrate 100, whereby the yield according to the present invention is guaranteed to 100%, and therefore productivity is remarkably improved.

As shown in FIGS. 3A to 3D, the shock compensation pattern unit 122 may be formed at one surface (FIG. 3A) or opposite surfaces (FIG. 3B) of the flexible portion F, or may be formed at one surface (FIG. 3C) or opposite surfaces (FIG. 3D) of each of the planar portion P and the flexible portion F.

Consequently, stress due to inherent defects and physical defects is dispersed by the shock compensation pattern unit 122 formed at one surface or opposite surfaces of the glass substrate 110, whereby strength properties and folding properties of the cover window are improved. In particular, the folding yield is guaranteed to 100%, which is unprecedented.

Also, in the present invention, the cover window 100 may have a thickness of 200 µm or less, preferably 20 to 100 µm. In this case, when an object having a small sectional area collides with the upper surface (the front surface) of the glass substrate 110, i.e. when pen drop occurs, the entire glass substrate 110 may be deformed or damaged around the pen-drop contact portion thereof.

In particular, for a cover window 100 having a slimmed flexible region, the thickness of the flexible region is particularly small, whereby pen-drop resistance properties thereof are very weak. In addition, a stress difference occurs due to a thickness difference between the flexible region and the planar region, whereby a waviness problem of the glass substrate 110 also occurs. As a result, shock resistance of the cover window is very low.

In the present invention, the shock compensation pattern unit 122 is formed at one surface or opposite surfaces of the glass substrate 110 in order to improve shock resistance through improvement in the pen-drop resistance properties at the flexible portion F and at the same time to improve folding properties and strength properties of the cover window. In particular, the shock compensation pattern unit 122 may be formed at both the planar portion P and the flexible portion F depending on the specifications of a product, although the shock compensation pattern unit 122 may be formed at only the flexible portion F.

In particular, the shock compensation pattern unit 122 may be formed so as to have a shape in which patterns are generally dispersed, rather than a conventional stripe shape. Preferably, the shock compensation pattern unit 122 is formed so as to have at least one of a polygonal shape, an oval shape, and a circular shape or a combination thereof as the horizontal sectional shape thereof.

Generally, in the case in which shock, such as pen drop, is applied to the cover window 100, shock that is transmitted vertically is stronger than shock that is transmitted horizontally. The shock compensation pattern unit 122 according to the present invention has a plurality of concave-convex-shaped patterns. Consequently, it is possible to efficiently disperse or support vertical shock, whereby it is possible to remarkably improve pen-drop resistance properties of the cover window.

That is, shock, such as pen drop, is transmitted into the glass substrate 110 and collides with or is absorbed by the concave-convex-shaped patterns of the shock compensation pattern unit 122, whereby the shock is efficiently dispersed or absorbed. In addition, gaps between the patterns are filled with a transparent resin material 130, a description of which will follow, whereby the effect of absorbing and supporting shock is remarkably improved.

Also, in the present invention, the shock compensation pattern unit 122 is formed at the flexible portion F, which is thin. Consequently, it is possible to eliminate a stress difference due to a thickness difference from the planar portion P, whereby it is possible to improve shock resistance and to minimize screen distortion or resolution lowering, and therefore it is possible to provide a high-quality rollable, slidable, and stretchable display.

In general, the rear surface of the glass substrate 110 (the surface of the glass substrate opposite the surface to which shock is applied) has lower resistance to pen drop. In an embodiment of the present invention, as shown in FIGS. 3A, 3C, 4A, 5A, 6A, and 6B, the shock compensation pattern unit 122 according to the present invention may be formed at the rear surface of the glass substrate 110 (the lower side in the figures).

Consequently, shock applied to the front surface (the touch surface) of the glass substrate 110 is transmitted into the glass substrate 110 and is dispersed or absorbed by the shock compensation pattern unit 122 having the concave-convex-shaped patterns.

In addition, as shown in FIGS. 3B, 3D, 4B, and 5B, the shock compensation pattern unit 122 may be formed at opposite surfaces of the glass substrate 110, i.e. the front surface and the rear surface of the glass substrate 110. Consequently, shock is primarily absorbed by the shock compensation pattern unit 122 formed at the front surface of the glass substrate 110, i.e. the surface of the glass substrate 110 including the contact portion to which shock is applied, and shock transmitted into the glass substrate 110 is absorbed by the shock compensation pattern unit 122 formed at the rear surface of the glass substrate 110.

Here, the shock compensation pattern unit 122 formed at the front flexible portion F and the shock compensation pattern unit 122 formed at the rear flexible portion F may be identical to or different from each other in terms of size of each pattern, distance between patterns, and height of each pattern depending on the specifications or use of a product.

Also, in the present invention, it is preferable that the height of the shock compensation pattern unit 122 be half or less of the thickness of the glass substrate 110 and be formed within a range of 10 to 30% based on the thickness of the glass substrate 110.

In the case in which the height of the shock compensation pattern unit 122 is less than the above range, the shock dispersion effect is insignificant. In the case in which the height of the shock compensation pattern unit 122 is greater than the above range, on the other hand, overall strength properties of the cover window are deteriorated due to a decrease in effective thickness.

In an embodiment of the present invention, the width a of the upper end of each pattern of the shock compensation pattern unit 122 is 0 to 1000 µm, the width b of the lower end of each pattern is 30 to 2000 µm, and the distance c between the patterns is 30 to 4000 µm.

In the case in which the size of each pattern is greater than the above range, folding properties of the cover window may be deteriorated. In the case in which the size of each pattern is less than the above range, on the other hand, pen-drop resistance properties of the cover window may be deteriorated. In the case in which the distance between the patterns is greater than the above range, pen-drop resistance properties of the cover window may be deteriorated. In the case in which the distance between the patterns is less than the above range, on the other hand, folding properties of the cover window may be deteriorated.

Also, it is preferable that the height (etched depth) d of each pattern of the shock compensation pattern unit 122 range from 0.0005 to 0.28 mm. In addition, the edge of each pattern of the shock compensation pattern unit is formed so as to have an inclination θ of 0.1 to 50 degrees with respect to a horizontal plane of the cover window. The inclination depends upon etching conditions of the shock compensation pattern unit. The height and inclination of each pattern of the shock compensation pattern unit are adjusted depending on the specifications of a product.

In the case in which the height of each pattern is less than the above range, shock absorption and dispersion functions may be insignificant. In the case in which the height of each pattern is greater than the above range, on the other hand, light reflection may occur from the inclined surface of each pattern or strength properties of the cover window may be deteriorated.

In the case in which the inclination of each pattern is less than the above range, the height of each pattern is too small, whereby shock absorption and dispersion functions are insignificant. In the case in which the inclination of each pattern is greater than the above range, on the other hand, there is high probability of light reflection occurring from the inclined surface of each pattern.

Also, it is preferable that the height of the shock compensation pattern unit 122 be equal to or less than the depth of the flexible portion F.

The above condition is necessary to improve folding properties of the cover window. In the case in which an etching process, a description of which will follow, is performed once, the height of the shock compensation pattern unit 122 and the depth of the flexible portion F are equal to each other. In the case in which the etching process is performed twice or more, on the other hand, the height of the shock compensation pattern unit 122 is less than the depth of the flexible portion F.

FIGS. 3 and 4 show the case in which the height of the shock compensation pattern unit 122 and the depth of the flexible portion F are equal to each other, and FIGS. 5 and 6 show the case in which the height of the shock compensation pattern unit 122 is less than the depth of the flexible portion F.

FIG. 3 shows the case in which height of the shock compensation pattern unit 122 and the depth of the flexible portion F are equal to each other, wherein FIG. 3A shows the case in which the shock compensation pattern unit 122 is formed at only one surface of the flexible portion F, FIG. 3B shows the case in which the shock compensation pattern unit 122 is formed at opposite surfaces of the flexible portion F, FIG. 3C shows the case in which the shock compensation pattern unit 122 is formed at one surface of the planar portion P and one surface of the flexible portion F, and FIG. 3D shows the case in which the shock compensation pattern unit 122 is formed at opposite surfaces of the planar portion P and opposite surfaces of the flexible portion F.

FIG. 4 shows the case in which the height of the shock compensation pattern unit 122 and the depth of the flexible portion F are equal to each other, wherein an inclined portion 124 is formed at the flexible portion F on the border with the planar portion P. FIG. 4A shows the case in which the shock compensation pattern unit 122 is formed at one surface of the flexible portion F, and FIG. 4B shows the case in which the shock compensation pattern unit 122 is formed at opposite surfaces of the flexible portion F.

FIG. 5 shows the case in which the height of the shock compensation pattern unit 122 is less than the depth of the flexible portion F, wherein an inclined portion 124 is formed at the flexible portion F on the border with the planar portion P. FIG. 5A shows the case in which the shock compensation pattern unit 122 is formed at one surface of the flexible portion F, and FIG. 5B shows the case in which the shock compensation pattern unit 122 is formed at opposite surfaces of the flexible portion F.

FIG. 6 shows the case in which the height of the shock compensation pattern unit 122 is less than the depth of the flexible portion F, wherein an inclined portion 124 is formed at the flexible portion F on the border with the planar portion P. FIG. 6A shows the case in which the shock compensation pattern unit 122 is formed at one surface of the planar portion P and one surface of the flexible portion F, and FIG. 6B shows the case in which the shock compensation pattern unit 122 is also formed at the inclined portion 124 of the flexible portion F.

That is, FIG. 6B shows the case in which the shock compensation pattern unit 122 is formed at the entire surface of the cover window.

The shock compensation pattern unit 122 may be formed through a dry or wet etching process. In an embodiment of the present invention, the shock compensation pattern unit 122 is formed through an etching process using a photo mask.

Hereinafter, a manufacturing method according to an embodiment of the present invention in the case in which the shock compensation pattern unit 122 is formed at only the flexible region will be described.

A shock compensation pattern unit 122 according to an embodiment of the present invention is formed through a wet etching process using a photo mask. As shown in FIGS. 7, 8, 9A and 9B, a shock compensation pattern unit 122 is formed by a first step of forming a resist layer on a glass substrate 110, a second step of patterning the resist layer to form a resist pattern layer for formation of a flexible portion F including a shock compensation pattern unit 122 on the glass substrate 110, a third step of forming a flexible portion F including a shock compensation pattern unit 122 so as to be adjacent to a planar portion P using the resist pattern layer as a mask, and a fourth step of removing the resist pattern layer.

Subsequently, the glass substrate 110 having the flexible portion F including the shock compensation pattern unit 122 formed thereon is strengthened in a fifth step, whereby a cover window 100 having the flexible portion F including the shock compensation pattern unit 122 formed thereon is completed.

In order to form the flexible portion F including the shock compensation pattern unit 122, first, a photoresist is coated on the glass substrate 110 or a dry film resist (DFR) is laminated on the glass substrate 110 to form a resist layer, and a resist pattern layer for formation of a flexible portion F including a shock compensation pattern unit 122 is formed on the glass substrate 110 through a patterning process for light exposure and development using a photo mask having a pattern corresponding to the resist layer.

Here, the resist pattern layer may be formed as a compensation pattern layer for formation of the shock compensation pattern unit 122, or may be realized as a compensation pattern layer for formation of the shock compensation pattern unit 122 and a gradation pattern layer for formation of an inclined portion 124 between the planar portion P and the flexible portion F at one side of the shock compensation pattern unit 122.

As shown, the flexible portion F according to the present invention may be formed in a vertical trench shape as the shape of the side surface thereof. Alternatively, the inclined portion 124 may be formed between the flexible portion F and the planar portion P in order to improve border visibility, as shown in FIGS. 2 to 6.

In the case in which the flexible portion F is formed in a vertical trench shape, the resist pattern layer may be formed as a compensation pattern layer for formation of the shock compensation pattern unit 122. In the case in which the inclined portion 124 is formed between the planar portion P and the flexible portion F, a compensation pattern layer for formation of the shock compensation pattern unit 122 may be formed, and a gradation pattern layer may be further formed at one side of the compensation pattern layer.

The compensation pattern layer is formed so as to have predetermined patterns for formation of the shock compensation pattern unit. In accordance with an embodiment of the present invention, the gradation pattern layer is realized as patterns having an open rate gradually decreasing from the flexible portion F to the planar portion P, and is formed so as to correspond to the region at which the inclined portion 124 is formed.

Depending on process conditions, a fine space may be provided between the DFR and the glass substrate 110 at the border of the flexible portion F to form the inclined portion 124 as the result of permeation of an etching solution, instead of the gradation pattern layer.

Subsequently, an etching process using the resist pattern layer as a mask is performed to form a flexible portion F including a shock compensation pattern unit 122 so as to be adjacent to the planar portion P.

In order to form the flexible portion F including the shock compensation pattern unit 122, the first step to the fourth step may be performed. Process conditions or the number of processes are adjusted to adjust shape or dimensions (size and interval) according to the specifications or use of a product in order to form the flexible portion F including the shock compensation pattern unit 122.

Figure 7:
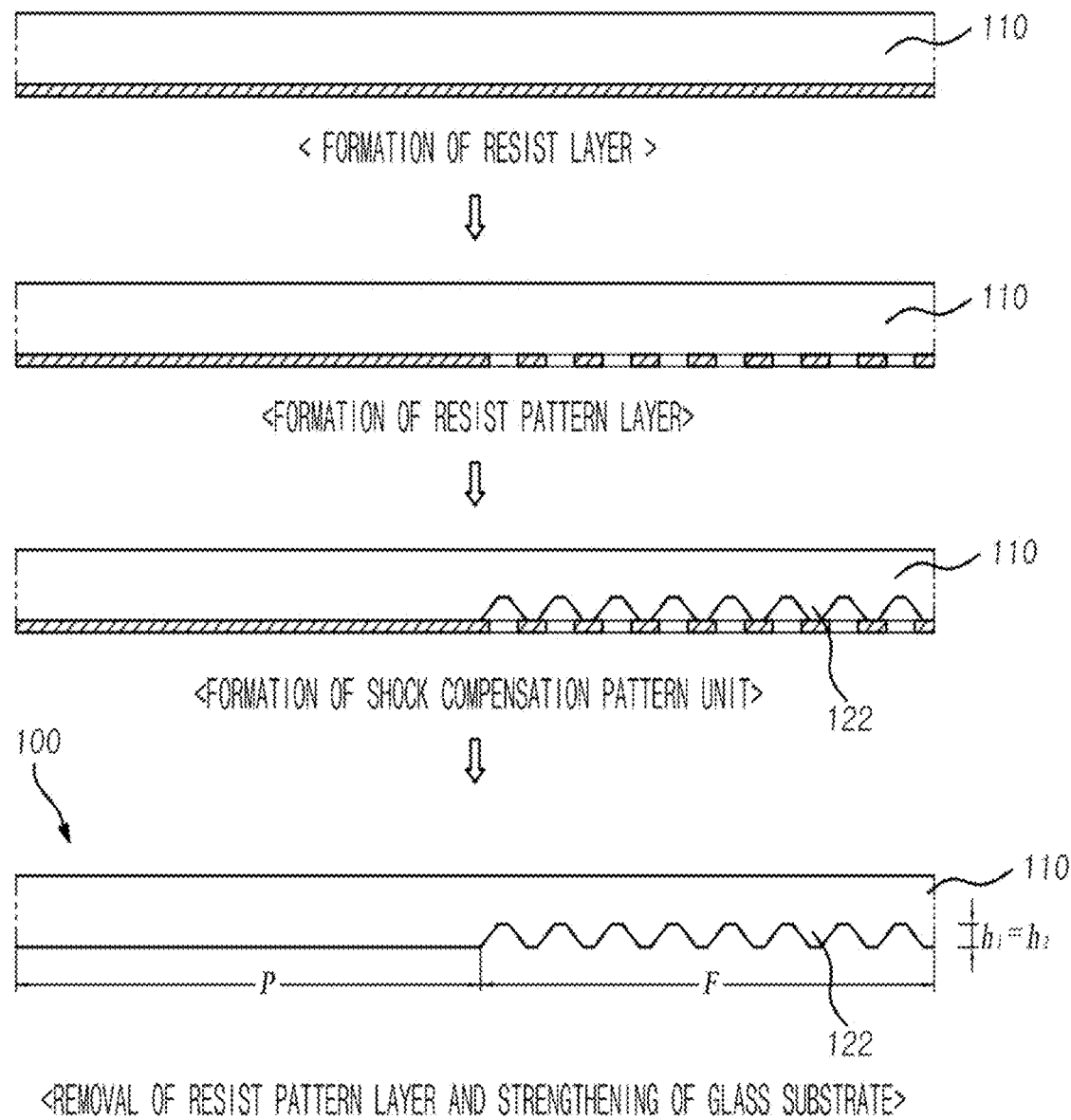
FIGS. 7, 8, 9A and 9B are schematic views showing rollable, slidable, and stretchable cover window manufacturing methods according to various embodiments of the present invention.
Figure 8:
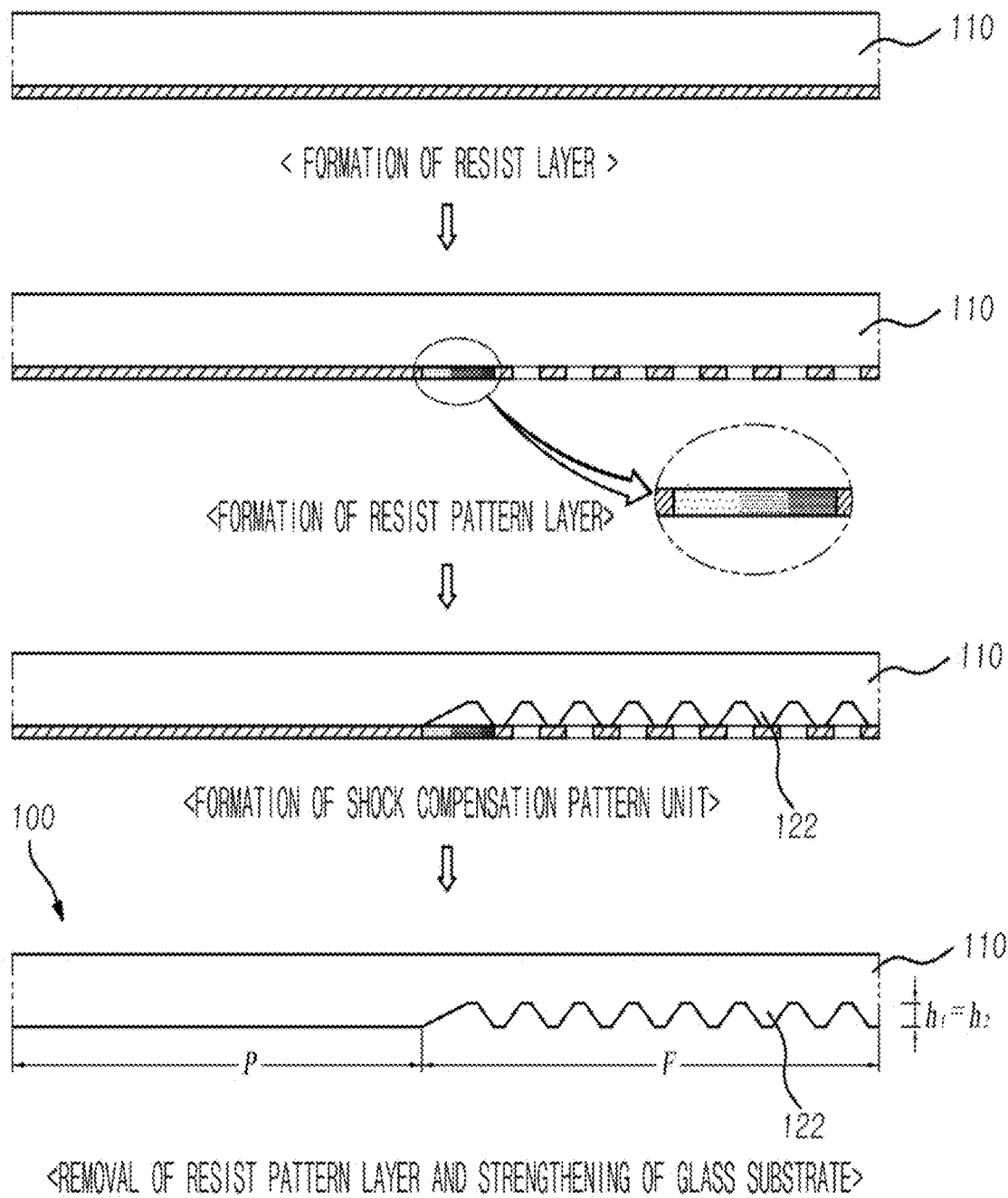
Figure 9A:
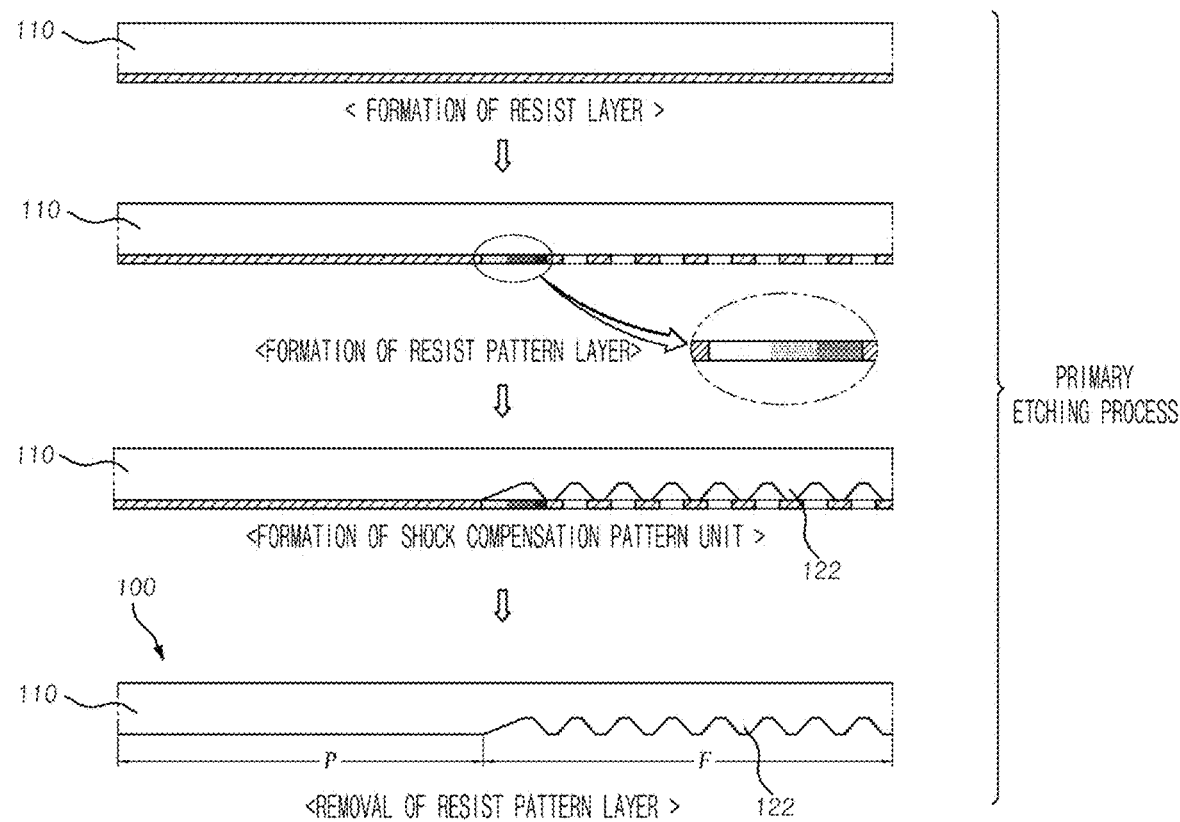
Figure 9B:
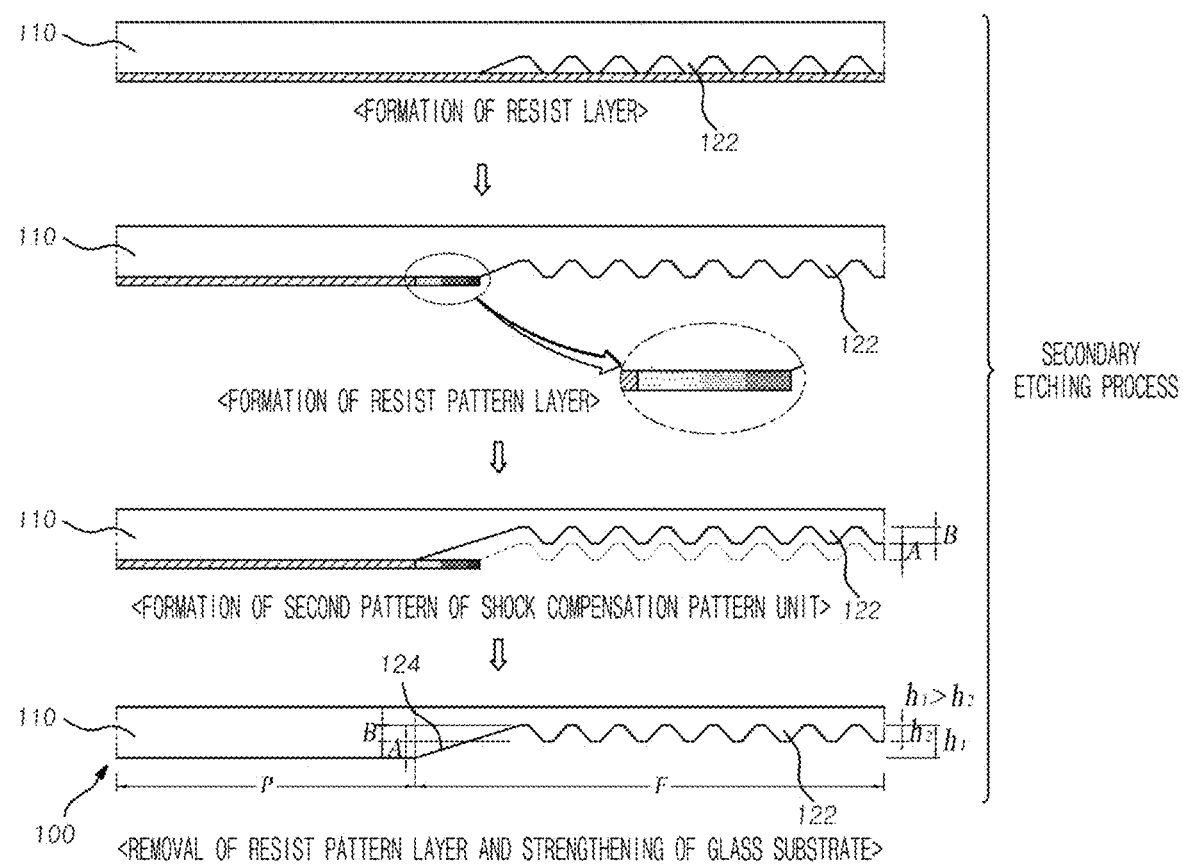

Preferably, the first step to the fourth step are performed once such that the height h2 of each pattern of the shock compensation pattern unit 122 is equal to the depth h1 of the flexible portion F, as shown in FIGS. 7 and 8, or the first step to the fourth step are performed twice or more such that the height h2 of each pattern of the shock compensation pattern unit 122 is less than the depth h1 of the flexible portion F (h1>h2), as shown in FIGS. 9A and 9B.

A method of manufacturing a rollable, slidable, and stretchable cover window 100 according to an embodiment of the present invention shown in FIG. 7 includes a process of forming a resist layer on a glass substrate 110, patterning the resist layer to form a resist pattern layer for formation of a flexible portion F including a shock compensation pattern unit 122 on the glass substrate 110, forming a flexible portion F including a shock compensation pattern unit 122 so as to be adjacent to the planar portion P using the resist pattern layer as a mask, removing the resist pattern layer, and strengthening the glass substrate 110.

Here, the resist pattern layer is realized as a compensation pattern layer formed so as to have predetermined patterns in order to form the flexible portion F including the shock compensation pattern unit 122.

As a result, a rollable, slidable, and stretchable cover window 100 having a flexible portion F including a shock compensation pattern unit 122 formed so as to be adjacent to the planar portion P is provided. According to this embodiment, the shape of the flexible portion F is identical to the shape of the shock compensation pattern unit 122, the height h1 of the flexible portion F and the height h2 of each pattern of the shock compensation pattern unit 122 are equal to each other (h1=h2), and the shape of the flexible portion F is approximate to a vertical trench shape.

Referring to FIG. 8, a method of manufacturing a rollable, slidable, and stretchable cover window 100 according to another embodiment of the present invention is similar to the method according to the embodiment of FIG. 5.

Here, the resist pattern layer is realized as a compensation pattern layer formed so as to have predetermined patterns in order to form the flexible portion F including the shock compensation pattern unit 122 and a gradation pattern layer for formation of an inclined portion 124 between the flexible portion F and the planar portion P.

As a result, a rollable, slidable, and stretchable cover window 100 having an inclined portion 124 formed at the border between the planar portion P and the flexible portion F and a flexible portion F including a shock compensation pattern unit 122 having concave-convex-shaped patterns formed at the flexible portion F is provided.

According to this embodiment, the flexible portion F includes the shock compensation pattern unit 122 and the inclined portion 124 at one side thereof, the height h1 of the flexible portion F and the height h2 of each pattern of the shock compensation pattern unit 122 are equal to each other (h1=h2), and the shape of the flexible portion F is approximate to a trapezoidal shape having the inclined portion 124 formed thereon.

Referring to FIGS. 9A and 9B, a method of manufacturing a rollable, slidable, and stretchable cover window 100 according to another embodiment of the present invention is similar to the methods according to the embodiments of FIGS. 7 and 8. In this embodiment, however, a wet etching process using a photo mask is performed a plurality of times in order to form a flexible portion F including a shock compensation pattern unit 122.

As shown, a primary etching process is performed to form a first pattern for formation of a shock compensation pattern unit 122, and a secondary etching process is performed to form a second pattern for formation of a shock compensation pattern unit 122.

Here, a resist pattern layer for formation of the first pattern is realized as a compensation pattern layer formed so as to have concave-convex shaped patterns in order to form a flexible portion F including a concave-convex shaped shock compensation pattern unit 122, or is realized as a compensation pattern layer formed so as to have circular patterns and a gradation pattern layer for formation of an inclined portion 124 at one side of the compensation pattern layer between the planar portion P and the flexible portion F.

A resist pattern layer for formation of the second pattern is formed such that the shock compensation pattern unit 122 region (the region corresponding to the first pattern) is open, or is formed such that the shock compensation pattern unit 122 region is open and a gradation pattern layer for formation of an inclined portion 124 is formed at the border between the flexible portion F and the planar portion P.

The gradation pattern layer may be realized in one or both of the primary etching process and the secondary etching process depending on the specifications of a product. In an embodiment of the present invention, a resist pattern layer realized as a gradation pattern layer is used in both of the primary etching process and the secondary etching process.

As a result, the shape of the first pattern is formed such that the height h1 of the flexible portion F and the height h2 of each pattern of the shock compensation pattern unit 122 are equal to each other, and the shape of the second pattern is formed such that the height h2 of each pattern of the shock compensation pattern unit 122 is less than the height h1 of the flexible portion F (h1>h2). Since the resist pattern layer for formation of the second pattern is formed such that the region corresponding to the first pattern is open, this region is mainly etched, and therefore the height h2 of each pattern of the shock compensation pattern unit 122 is less than the height h1 of the flexible portion F (h1>h2).

Here, the etching depth A according to the primary etching process is 0.0005 to 0.28 mm, and the etching depth B according to the secondary etching process is 0.01 to 0.2 mm.

The etching depth according to the primary etching process and the etching depth according to the secondary etching process may be adjusted to control the height of each pattern of the shock compensation pattern unit 122 at the flexible portion F, whereby it is possible to improve pen-drop resistance properties and folding properties of the cover window.

In the case in which the difference between the etching depth according to the primary etching process and the etching depth according to the secondary etching process is too large, strength properties of the cover window are deteriorated. In the case in which the difference between the etching depth according to the primary etching process and the etching depth according to the secondary etching process is too small, there is no difference in folding properties of the cover window.

According to this embodiment, therefore, the flexible portion F includes the shock compensation pattern unit 122 and the inclined portion 124 formed at one side thereof, and the height h2 of each pattern of the shock compensation pattern unit 122 is less than the height h1 of the flexible portion F (h1>h2), whereby the shape of the flexible portion F is approximate to a trapezoidal shape having the inclined portion 124 formed thereon, and a shock compensation pattern unit 122 having a small height is formed at the central part thereof.

As described above, the flexible portion F including the shock compensation pattern unit 122 having the predetermined concave-convex-shaped patterns is formed on the glass substrate 110, whereby vertical shock, such as pen drop, is supported and dispersed. In addition, the effective thickness of the glass substrate 110 is reduced, although the overall thickness of the glass substrate is little reduced, whereby it is possible to improve resistance to pen drop, folding properties, and overall strength properties of the cover window.

Subsequently, the glass substrate 110 having the flexible portion F including the shock compensation pattern unit 122 having the concave-convex-shaped patterns formed thereon undergoes a strengthening process, as shown in FIGS. 7, 8, 9A and 9B. A chemical strengthening process is generally used as the strengthening process.

For a cover window 100 having a flexible portion F of a small thickness formed thereon, it is difficult to simultaneously satisfy folding properties and strength properties of the planar portion P and the flexible portion F at the time of performing the chemical strengthening process, since tensile stress (CT) values of the planar portion P and the flexible portion F are different from each other. For this reason, an additional chemical process may be further performed with respect to the planar portion P (adjustment of strengthening depth DOL).

Meanwhile, in an embodiment of the present invention, the shock compensation pattern unit 122 is formed at one surface, i.e. the rear surface, of the glass substrate 110 in accordance with the embodiment of FIG. 5A, and the shock compensation pattern unit 122 is filled with a transparent resin material 130 such that the transparent resin material is joined to the entire surface of the display panel without an empty space, as shown in FIG. 10.

Gaps between the concave-convex-shaped patterns of the shock compensation pattern unit 122 are filled with the transparent resin material 130, whereby a cover window 100 having a generally uniform thickness is provided and shock is absorbed. In addition, there is no empty space (air layer) when the transparent resin material is joined to the entire surface of the display panel, whereby visibility and joinability are improved.

A transparent resin having a refractive index almost equal to the refractive index (1.5) of glass, such as an optically clear resin (OCR), may be used as the transparent resin material 130. For example, acrylic, epoxy, silicone, urethane, a urethane compound, a urethane acrylic compound, a sol-gel hybrid solution, or a siloxane-based resin may be used. The transparent resin material 130 may be used in various combinations depending on the properties thereof in order to improve strength and elasticity.

In addition, a transparent resin layer 140 may be formed on the transparent resin material 130 above the shock compensation pattern unit 122. The transparent resin material 130 and the transparent resin layer 140 may be successively formed through the same process using the same material. Alternatively, the transparent resin material 130 and the transparent resin layer 140 may be successively formed through sequential processes using the same material or different materials.

That is, the transparent resin material 130 and the transparent resin layer 140 may be simultaneously formed through the same process, or may be separately formed through different processes as needed. In addition, each of the transparent resin material 130 and the transparent resin layer 140 may be formed in a single-layer structure or a multilayer structure so as to have a specific functionality.

The transparent resin layer 140 may be formed at the front surface and the rear surface of the glass substrate 110, or may be formed at the front surface, the rear surface, and the entire side surface of the glass substrate 110. The transparent resin layer 140 formed at the rear surface of the glass substrate 110 and the transparent resin layer 140 formed at the front surface of the glass substrate 110 may be made of the same material. Alternatively, the transparent resin layer 140 formed at the rear surface of the glass substrate 110 may be made of a softer material than the transparent resin layer 140 formed at the front surface of the glass substrate 110.

The reason for this is that it is necessary to form a transparent resin layer 140 made of a hard material at the user touch portion in order to maintain durability.

FIG. 11 shows that the shock compensation pattern unit 122 is formed at the rear surface of the glass substrate 110, and the shock compensation pattern unit 122 is filled with the transparent resin material 130, and the transparent resin layer 140 is formed at the upper side of the transparent resin material 130 on the glass substrate 110 in accordance with the embodiment of FIG. 10, a shock-absorbing resin layer 150 is formed at the front surface of the glass substrate 110, and a cover glass substrate 160 is formed on the shock-absorbing resin layer 150.

That is, the shock-absorbing resin layer 150 is formed between the glass substrate 110 and the cover glass substrate 160, and the shock compensation pattern unit 122 is formed at the rear surface of the glass substrate 110.

In the case in which a shock is applied to the front surface, therefore, shock is primarily absorbed by the shock-absorbing resin layer 150, and the shock is secondarily absorbed by the shock compensation pattern unit 122.

In this case, each of the cover glass substrate 160 and the glass substrate 110 may be formed so as to have a smaller thickness. In addition, resistance to pen drop is improved, folding properties are improved, and overall strength is increased.

FIG. 12 shows that a transparent resin layer 140 is formed at the front surface of the glass substrate 110 (FIG. 12A) or is further formed at the front surface of the glass substrate 160 (FIG. 12B), compared to the embodiment of FIG. 10. As described above, the transparent resin layer 140 formed at the front surface is made of a harder material than the transparent resin layer 140 formed at the rear surface.

As shown in FIGS. 10 to 12, the cover window according to the present invention is realized using a combination of glass and a resin material, whereby flexibility, restoring force, elastic force, and strength properties are reinforced by the resin material while texture of the glass is maximally maintained.

Particularly, in an embodiment of the present invention, the flexible portion F including the shock compensation pattern unit 122 is formed on the glass substrate 110, and the transparent resin material 130 and the transparent resin layer 140 are further formed, whereby it is possible to further disperse or absorb shock, such as pen drop, and therefore it is possible to further improve shock resistance of the cover window.

In addition, the shock compensation pattern unit 122 is uniformly filled with the transparent resin material 130, whereby it is possible to secure flatness at the portion that abuts the display panel while minimizing in-plane crack propagation in the flexible portion F and preventing the shock compensation pattern unit 122 from being visible from outside.

In addition, the elasticity of the cover window 100 at the surface thereof that abuts the display panel is reinforced, whereby it is possible to improve shock resistance and to prevent the glass from being scattered when the glass is broken.

Meanwhile, as shown in FIG. 13, a functional coating layer 170 may be further formed at one surface or opposite surfaces of the cover window 100, compared to the embodiment of FIG. 12. The functional coating layer 170 is made of a transparent material, like the transparent resin material 130. Resins having various properties may be combined to provide functionality.

In the case in which the shock compensation pattern unit 122 is filled with the transparent resin material 130 or in the case in which the transparent resin layer 140 is formed at the entire surface of the glass substrate 110, the functional coating layer 170 may be formed thereon. The functional coating layer 170 may be formed using a known resin coating method, such as spraying, dipping, or spin coating.

The functional coating layer 170 may be formed so as to have a single-layer structure or a multilayer structure. The functional coating layer 170 formed at the front surface of the cover window 100 may be realized as a strength reinforcement layer, and the functional coating layer 170 formed at the rear surface of the cover window 100 may be realized as an elasticity reinforcement layer.

That is, since touch is performed at the front surface of the cover window 100, a functional coating layer 170 having further reinforced strength is realized, and a functional coating layer 170 having reinforce elasticity may be realized at the rear surface of the cover window 100 so as to perform shock-absorbing action between the display panel and the cover window 100.

The strength reinforcement layer (hard coating) at the front surface of the cover window 100 is made of a material including a high content of a resin having relatively high hardness when hardened, such as acrylic or epoxy, and the elasticity reinforcement layer (soft coating) at the rear surface of the cover window 100 is made of a material including a high content of a resin having relatively high elasticity when hardened, such as silicone or a urethane composite resin. In addition, the content of an organic material and an inorganic material in an organic and inorganic sol-gel hybrid solution may be adjusted in order to reinforce strength or elasticity.

Also, in the case in which the functional coating layer 170 is formed so as to have a multilayer structure, it is preferable that the functional coating layer 170 formed at the front surface of the cover window 100 be made of a material having hardness gradually increasing toward the upper layer portion.

In addition, an anti-fingerprint (AF) or anti-reflective (AR) function may be imparted to the functional coating layer 170, particularly the uppermost layer portion of the functional coating layer 170. Resins having such a function may be combined, or various patterns, such as a moth-eye pattern, may be formed at the functional coating layer 170 to realize the function.

As described above, basically, the functional coating layer 170 is further formed at the cover window 100 according to the present invention in order to reinforce strength and elasticity based on use of the thin glass substrate 110, whereby it is possible to protect the cover window 100 against external shock or pressure of a stylus.

In addition, the functional coating layer 170 further prevents in-plane crack propagation in the flexible region and reinforces elasticity of the cover window 100 at the surface thereof that abuts the display panel, whereby it is possible to improve shock resistance while performing a scattering prevention function.

FIG. 14 is a sectional view schematically showing a slidable cover window 100 according to an embodiment of the present invention, showing that the shock compensation pattern unit 122 is formed at the flexible portion F and the transparent resin material 130 and that the transparent resin layer 140 are formed at the upper surface thereof in accordance with the embodiment of FIG. 10, wherein the cover window 100 is slid.

FIG. 15 is a sectional view schematically showing a slidable cover window 100 according to another embodiment of the present invention, showing that the shock compensation pattern unit 122 is formed at the planar portion P and the flexible portion F, that the shock compensation pattern unit 122 is also formed at the inclined portion 124, and that the transparent resin material 130 and the transparent resin layer 140 are formed at the upper surface thereof in accordance with the embodiment of FIG. 6B, wherein the cover window 100 is slid.

FIG. 16 is a view showing a front image of the slidable cover window according to the embodiment of FIG. 15, wherein the shock compensation pattern unit is uniformly formed throughout the planar portion P and the flexible portion F including the inclined portion 124.

FIG. 17 is a view showing a sectional image of the slidable cover window according to the embodiment of FIG. 15, wherein the shock compensation pattern unit is uniformly formed throughout the planar portion P and the flexible portion F including the inclined portion 124.

In accordance with the embodiment of FIG. 10, a shock compensation pattern unit having concave-convex-shaped patterns (height of 0.03 mm, upper end width of 0.05 mm, lower end width of 0.1 mm, and interval of 0.15 mm) was formed at the flexible portion (height of 0.045 mm) on the rear surface of a glass substrate (thickness of 0.08 t), filling with an acrylic-based transparent resin material (thickness of 0.01 mm) was performed, and an acrylic-based transparent resin (thickness of 0.01 mm) was formed thereon to manufacture a slidable cover window. The folding properties and pen-drop resistance properties of the slidable cover window were measured.

The result of measurement of the folding properties of the slidable cover window manufactured as described above (evaluation of folding limit using a two-point bending method, based on 2R) reveals a yield of 100% without defective products.

The result of measurement of the pen-drop resistance properties of the slidable cover window according to the above embodiment (a pen drop test was performed using a pen having a ball size of 0.5 mm and a weight of 6.2 g, and the pen was freely dropped onto the front surface of the glass substrate from various heights to measure the height at which the cover window was broken) reveals that the cover window was broken by pen drop from an average height of 8 cm, which is remarkably higher than a commercialized level.

The rollable, slidable, and stretchable cover window according to the present invention includes the shock compensation pattern unit having the concave-convex-shaped patterns, whereby it is possible to prevent in-plane crack propagation, to disperse stress, and to increase pen-drop resistance through dispersion of shock between the patterns at the time of pen drop, and therefore it is possible to simultaneously improve strength properties and folding properties of the cover window.

Consequently, it is possible to provide a rollable, slidable, and stretchable cover window capable of remarkably improving product yield and productivity and reducing processing costs.

As is apparent from the above description, the present invention relates to a rollable, slidable, and stretchable cover window, and more particularly to a rollable, slidable, and stretchable cover window having a shock compensation pattern unit formed on a glass substrate in order to disperse shock, whereby shock resistance of the rollable, slidable, and stretchable cover window is improved and strength and folding properties of the rollable, slidable, and stretchable cover window are secured.

That is, the shock compensation pattern unit is realized on the glass substrate, whereby it is possible to prevent in-plane microscopic crack propagation and to disperse stress. In addition, at the time of pen drop, the shock is dispersed between patterns to increase resistance to pen drop, and therefore it is possible to simultaneously improve strength properties and folding properties of the rollable, slidable, and stretchable cover window.

In addition, the shock compensation pattern unit is realized on the glass substrate, whereby it is possible to remove scratches or microscopic cracks from the surface of the glass substrate, and therefore it is possible to further improve yield while improving strength properties and folding properties of the rollable, slidable, and stretchable cover window due to removal or reduction of appearance defects.

In addition, the rollable, slidable, and stretchable cover window according to the present invention is realized using a combination of glass and a resin material, whereby flexibility, restoring force, elastic force, and strength properties are reinforced by the resin material while texture of the glass is maximally maintained. In particular, the resin material absorbs shock, such as pen drop, whereby shock resistance is further improved. Consequently, it is possible to provide a rollable, slidable, and stretchable cover window made of a composite material, wherein shock resistance of the rollable, slidable, and stretchable cover window is further improved and the shock compensation pattern unit is not visible from outside.

In addition, a shock-absorbing resin layer is formed on the entire surface between glass substrates in order to absorb shock, such as pen drop, or to effectively transmit the shock outside, whereby pen-drop resistance properties of the cover window are further improved.

In addition, it is possible to prevent occurrence of stress due to a thickness difference between the planar region and the folding region, which occurs in a conventional cover window having a slimmed folding region. Consequently, it is possible to improve shock resistance and to minimize screen distortion or resolution lowering, and therefore it is possible to provide a high-quality rollable, slidable, and stretchable display.

Although the present invention has been described in detail based on concrete embodiments, those skilled in the art will appreciate that the present invention is not limited thereto and that various modifications, additions, and substitutions are possible without departing from the scope and spirit of the invention as disclosed in the accompanying claims.

What is claimed is:

1. A rollable, slidable, and stretchable cover window comprising a planar portion formed so as to correspond to a planar region of a rollable, slidable, and stretchable display and a flexible portion formed so as to be connected to the planar portion, the flexible portion being formed so as to correspond to a flexible region of the rollable, slidable, and stretchable display, wherein
   the rollable, slidable, and stretchable cover window comprises:
   a glass substrate; and
   a shock compensation pattern unit formed on the glass substrate, and
   the shock compensation pattern unit is formed at the flexible portion or is formed at each of the planar portion and the flexible portion, the shock compensation pattern unit having concave-convex-shaped patterns.

2. The rollable, slidable, and stretchable cover window according to claim 1, wherein a height of each of the patterns of the shock compensation pattern unit is 0.0005 to 0.28 mm.

3. The rollable, slidable, and stretchable cover window according to claim 1, wherein the shock compensation pattern unit is formed such that a width of an upper end of each pattern is 1000 μm or less, a width of a lower end of each pattern is 30 to 2000 μm, and a distance between the patterns is 30 to 4000 μm.

4. The rollable, slidable, and stretchable cover window according to claim 1, wherein an edge of each pattern of the shock compensation pattern unit has an inclination of 0.1 to 50 degrees with respect to a horizontal plane of the cover window.

5. The rollable, slidable, and stretchable cover window according to claim 1, wherein the concave-convex-shaped patterns of the shock compensation pattern unit are formed so as to have at least one of a polygonal shape, an oval shape, and a circular shape or a combination thereof as a horizontal sectional shape thereof.

6. The rollable, slidable, and stretchable cover window according to claim 1, wherein the shock compensation pattern unit is formed at one surface or opposite surfaces of the glass substrate.

7. The rollable, slidable, and stretchable cover window according to claim 1, wherein a height of each of the patterns of the shock compensation pattern unit formed at the flexible portion is less than a depth of the flexible portion.

8. The rollable, slidable, and stretchable cover window according to claim 1, wherein the shock compensation pattern unit is realized through an etching process.

9. The rollable, slidable, and stretchable cover window according to claim 8, wherein
the etching process comprises: a primary etching process of forming a first pattern at an entire surface of the glass substrate; and a secondary etching process of further etching the flexible region to form a second pattern,
the shock compensation pattern unit formed at the flexible portion is realized by the second pattern, and
the shock compensation pattern unit formed at the planar portion is realized by the first pattern.

10. The rollable, slidable, and stretchable cover window according to claim 8, wherein
the etching process comprises: a primary etching process of forming a first pattern at the flexible portion; and a secondary etching process of etching an entire surface of the glass substrate to form a second pattern at the first pattern region as a result of further etching of the first pattern and to form a third pattern at the planar portion,
the shock compensation pattern unit formed at the flexible portion is realized by the second pattern, and
the shock compensation pattern unit formed at the planar portion is realized by the third pattern.

11. The rollable, slidable, and stretchable cover window according to claim 9, wherein an etching depth according to the primary etching process is 0.0005 to 0.28 mm.

12. The rollable, slidable, and stretchable cover window according to claim 9, wherein an etching depth according to the secondary etching process is 0.01 to 0.2 mm.

13. The rollable, slidable, and stretchable cover window according to claim 8, wherein the flexible portion has an inclined portion formed at a border with the planar portion.

14. The rollable, slidable, and stretchable cover window according to claim 1, wherein the patterns of the shock compensation pattern unit are regularly or irregularly formed so as to have an identical size or different sizes.

15. The rollable, slidable, and stretchable cover window according to claim 14, wherein the patterns of the shock compensation pattern unit are realized so as to have a lattice array or a cross array.

16. The rollable, slidable, and stretchable cover window according to claim 15, wherein
pattern density of the shock compensation pattern unit formed at the flexible portion and pattern density of the shock compensation pattern unit formed at the planar portion are equal to each other, or
pattern density of the shock compensation pattern unit formed at the flexible portion is higher than pattern density of the shock compensation pattern unit formed at the planar portion.

17. The rollable, slidable, and stretchable cover window according to claim 1, further comprising:
a shock-absorbing resin layer formed at a front surface of the glass substrate, at which the shock compensation pattern unit is formed; and
a cover glass substrate formed on the shock-absorbing resin layer.

18. The rollable, slidable, and stretchable cover window according to claim 17, wherein the patterns of the shock compensation pattern unit are filled with a transparent resin material.

19. The rollable, slidable, and stretchable cover window according to claim 18, wherein
a transparent resin layer is formed on the transparent resin material above the shock compensation pattern unit, and
the transparent resin material and the transparent resin layer are successively formed through an identical process using an identical material, or
the transparent resin material and the transparent resin layer are successively formed through sequential processes using an identical material or different materials.

20. The rollable, slidable, and stretchable cover window according to claim 19, wherein the transparent resin layer is formed:
at the front surface and a rear surface of the glass substrate; or
at the front surface, the rear surface, and an entire side surface of the glass substrate.

21. The rollable, slidable, and stretchable cover window according to claim 18, wherein
the transparent resin layer formed at the rear surface of the glass substrate and the transparent resin layer formed at the front surface of the glass substrate are made of an identical material, or
the transparent resin layer formed at the rear surface of the glass substrate is made of a softer material than the transparent resin layer formed at the front surface of the glass substrate.

22. The rollable, slidable, and stretchable cover window according to claim 1, wherein the flexible portion is formed so as to have a smaller thickness than the planar portion.

23. A method of manufacturing a rollable, slidable, and stretchable cover window comprising a planar portion formed so as to correspond to a planar region of a rollable, slidable, and stretchable display and a flexible portion formed so as to be connected to the planar portion, the flexible portion being formed so as to correspond to a flexible region of the rollable, slidable, and stretchable display, the method comprising:
a first step of forming a resist layer on a glass substrate;
a second step of patterning the resist layer to form a resist pattern layer for formation of a first pattern on an entire surface or a flexible region of the glass substrate;
a third step of performing a primary etching process using the resist pattern layer of the second step as a mask to form a first pattern on the entire surface or the flexible region of the glass substrate and removing the resist pattern layer;
a fourth step of forming a resist layer on the glass substrate having the first pattern formed thereon;
a fifth step of patterning the resist layer to form a resist pattern layer for formation of a second pattern on the flexible region or to form a resist pattern layer for formation of a second pattern on the flexible region and for formation of a third pattern on a planar region of the glass substrate;
a sixth step of performing a secondary etching process using the resist pattern layer of the fifth step as a mask to further etch the flexible region, thereby forming a second pattern at the flexible region, or to etch the entire surface of the glass substrate, thereby forming a second pattern at the flexible region and forming a third pattern at the planar region, and removing the resist pattern layer; and a seventh step of strengthening the glass substrate, whereby a shock compensation pattern unit is formed at the flexible portion and the planar portion.

24. The method according to claim 23, wherein a height of each of the patterns of the shock compensation pattern unit is 0.0005 to 0.28 mm.

25. The method according to claim 23, wherein the shock compensation pattern unit is formed such that a width of an upper end of each pattern is 1000 µm or less, a width of a lower end of each pattern is 30 to 2000 µm, and a distance between the patterns is 30 to 4000 µm.

26. The method according to claim 23, wherein an edge of each pattern of the shock compensation pattern unit has an inclination of 0.1 to 50 degrees with respect to a horizontal plane of the cover window.

27. The method according to claim 23, wherein the shock compensation pattern unit has concave-convex-shaped patterns that are formed so as to have at least one of a polygonal shape, an oval shape, and a circular shape or a combination thereof as a horizontal sectional shape thereof.

28. The method according to claim 23, wherein the resist pattern layer is realized as:

a compensation pattern layer for formation of the first pattern, the second pattern, and the third pattern; or a compensation pattern layer for formation of the first pattern, the second pattern, and the third pattern and a gradation pattern layer for formation of an inclined portion at a border of the first pattern and a border between the second pattern and the third pattern.

29. The method according to claim 23, wherein the shock compensation pattern unit is formed at one surface or opposite surfaces of the glass substrate.

30. The method according to claim 23, wherein an etching depth according to the primary etching process is 0.0005 to 0.28 mm.

31. The method according to claim 23, wherein an etching depth according to the secondary etching process is 0.01 to 0.2 mm.

32. The method according to claim 23, wherein the patterns of the shock compensation pattern unit are regularly or irregularly formed so as to have an identical size or different sizes.

33. The method according to claim 32, wherein the patterns of the shock compensation pattern unit are realized so as to have a lattice array or a cross array.

34. The method according to claim 33, wherein pattern density of the shock compensation pattern unit formed at the flexible portion and pattern density of the shock compensation pattern unit formed at the planar portion are equal to each other, or pattern density of the shock compensation pattern unit formed at the flexible portion is higher than pattern density of the shock compensation pattern unit formed at the planar portion.

35. The method according to claim 23, wherein the rollable, slidable, and stretchable cover window further comprises:

a shock-absorbing resin layer formed at a front surface of the glass substrate, at which the shock compensation pattern unit is formed; and a cover glass substrate formed on the shock-absorbing resin layer.

36. The method according to claim 35, wherein the patterns of the shock compensation pattern unit are filled with a transparent resin material.

37. The method according to claim 36, wherein a transparent resin layer is formed on the transparent resin material above the shock compensation pattern unit, and the transparent resin material and the transparent resin layer are successively formed through an identical process using an identical material, or the transparent resin material and the transparent resin layer are successively formed through sequential processes using an identical material or different materials.

38. The method according to claim 37, wherein the transparent resin layer is formed:

at the front surface and a rear surface of the glass substrate; or at the front surface, the rear surface, and an entire side surface of the glass substrate.

39. The method according to claim 38, wherein the transparent resin layer formed at the rear surface of the glass substrate and the transparent resin layer formed at the front surface of the glass substrate are made of an identical material, or the transparent resin layer formed at the rear surface of the glass substrate is made of a softer material than the transparent resin layer formed at the front surface of the glass substrate.

40. The rollable, slidable, and stretchable cover window according to claim 10, wherein an etching depth according to the primary etching process is 0.0005 to 0.28 mm.

41. The rollable, slidable, and stretchable cover window according to claim 10, wherein an etching depth according to the secondary etching process is 0.01 to 0.2 mm.

* * * * *